United States Patent
Shigihara et al.

(10) Patent No.: US 9,466,559 B2
(45) Date of Patent: *Oct. 11, 2016

(54) SEMICONDUCTOR INTEGRATED CIRCUIT DEVICE

(75) Inventors: Hiromi Shigihara, Tokyo (JP); Hiroshi Tsukamoto, Tokyo (JP); Akira Yajima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/229,887

(22) Filed: Sep. 12, 2011

(65) Prior Publication Data

US 2012/0032329 A1 Feb. 9, 2012

Related U.S. Application Data

(62) Division of application No. 12/628,869, filed on Dec. 1, 2009, now Pat. No. 8,063,489.

(30) Foreign Application Priority Data

Dec. 3, 2008 (JP) .................................. 2008-308585
Aug. 18, 2009 (JP) .................................. 2009-188913

(51) Int. Cl.
*H01L 23/498* (2006.01)
*H01L 23/00* (2006.01)
(Continued)

(52) U.S. Cl.
CPC ....... *H01L 23/49816* (2013.01); *H01L 23/485* (2013.01); *H01L 24/05* (2013.01);
(Continued)

(58) Field of Classification Search
None
See application file for complete search history.

(56) References Cited

U.S. PATENT DOCUMENTS 5,631,499 A * 5/1997 Hosomi et al. ............... 257/737
6,127,724 A   10/2000 DiStefano
(Continued)

FOREIGN PATENT DOCUMENTS

CN    1643684 A      7/2005
JP    60-054462      3/1985
(Continued)

OTHER PUBLICATIONS

Wikipedia—Solder Nov. 19, 2012 http://en.wikipedia.org/wiki/Solder.*

(Continued)

*Primary Examiner* — Whitney T Moore
*Assistant Examiner* — Scott R Wilson
(74) *Attorney, Agent, or Firm* — Shapiro, Gabor and Rosenberger, PLLC

(57) ABSTRACT

In semiconductor integrated circuit devices for vehicle use, an aluminum pad on a semiconductor chip and an external device are coupled to each other by wire bonding using a gold wire for the convenience of mounting. Such a semiconductor integrated circuit device, however, causes a connection failure due to the interaction between aluminum and gold in use for a long time at a relatively high temperature (about 150 degrees C.). A semiconductor integrated circuit device can include a semiconductor chip as a part of the device, an electrolytic gold plated surface film (gold-based metal plated film) provided over an aluminum-based bonding pad on a semiconductor chip via a barrier metal film, and a gold bonding wire (gold-based bonding wire) for interconnection between the plated surface film and an external lead provided over a wiring board (wiring substrate).

16 Claims, 31 Drawing Sheets

(51) Int. Cl.
*H01L 25/065* (2006.01)
*H01L 23/485* (2006.01)
*H01L 21/66* (2006.01)

(52) U.S. Cl.
CPC .............. *H01L 24/06* (2013.01); *H01L 24/12* (2013.01); *H01L 24/16* (2013.01); *H01L 24/48* (2013.01); *H01L 24/49* (2013.01); *H01L 24/81* (2013.01); *H01L 24/85* (2013.01); *H01L 25/0657* (2013.01); H01L 22/32 (2013.01); H01L 24/45 (2013.01); H01L 24/73 (2013.01); H01L 24/78 (2013.01); H01L 2224/02166 (2013.01); H01L 2224/0347 (2013.01); H01L 2224/0401 (2013.01); H01L 2224/04042 (2013.01); H01L 2224/05027 (2013.01); H01L 2224/0568 (2013.01); H01L 2224/05082 (2013.01); H01L 2224/05083 (2013.01); H01L 2224/05084 (2013.01); H01L 2224/05124 (2013.01); H01L 2224/05144 (2013.01); H01L 2224/05147 (2013.01); H01L 2224/05155 (2013.01); H01L 2224/05157 (2013.01); H01L 2224/05164 (2013.01); H01L 2224/05166 (2013.01); H01L 2224/05169 (2013.01); H01L 2224/05173 (2013.01); H01L 2224/05181 (2013.01); H01L 2224/05184 (2013.01); H01L 2224/05553 (2013.01); H01L 2224/05554 (2013.01); H01L 2224/05558 (2013.01); H01L 2224/05568 (2013.01); H01L 2224/05572 (2013.01); H01L 2224/05624 (2013.01); H01L 2224/05644 (2013.01); H01L 2224/05647 (2013.01); H01L 2224/05655 (2013.01); H01L 2224/1134 (2013.01); H01L 2224/13099 (2013.01); H01L 2224/13144 (2013.01); H01L 2224/13147 (2013.01); H01L 2224/16225 (2013.01); H01L 2224/2919 (2013.01); H01L 2224/29198 (2013.01); H01L 2224/32145 (2013.01); H01L 2224/32225 (2013.01); H01L 2224/32245 (2013.01); H01L 2224/45124 (2013.01); H01L 2224/45144 (2013.01); H01L 2224/45147 (2013.01); H01L 2224/45164 (2013.01); H01L 2224/4807 (2013.01); H01L 2224/4868 (2013.01); H01L 2224/4878 (2013.01); H01L 2224/4888 (2013.01); H01L 2224/48095 (2013.01); H01L 2224/48145 (2013.01); H01L 2224/48247 (2013.01); H01L 2224/48453 (2013.01); H01L 2224/48465 (2013.01); H01L 2224/48471 (2013.01); H01L 2224/48507 (2013.01); H01L 2224/48624 (2013.01); H01L 2224/48639 (2013.01); H01L 2224/48644 (2013.01); H01L 2224/48647 (2013.01); H01L 2224/48655 (2013.01); H01L 2224/48664 (2013.01); H01L 2224/48724 (2013.01); H01L 2224/48739 (2013.01); H01L 2224/48744 (2013.01); H01L 2224/48747 (2013.01); H01L 2224/48755 (2013.01); H01L 2224/48764 (2013.01); H01L 2224/48824 (2013.01); H01L 2224/48839 (2013.01); H01L 2224/48844 (2013.01); H01L 2224/48847 (2013.01); H01L 2224/48855 (2013.01); H01L 2224/48864 (2013.01); H01L 2224/49171 (2013.01); H01L 2224/49175 (2013.01); H01L 2224/73204 (2013.01); H01L 2224/73265 (2013.01); H01L 2224/78301 (2013.01); H01L 2224/81193 (2013.01); H01L 2224/81801 (2013.01); H01L 2224/83101 (2013.01); H01L 2224/85181 (2013.01); H01L 2224/85186 (2013.01); H01L 2224/85205 (2013.01); H01L 2224/85207 (2013.01); H01L 2224/85439 (2013.01); H01L 2224/85444 (2013.01); H01L 2224/85464 (2013.01); H01L 2225/0651 (2013.01); H01L 2225/06517 (2013.01); H01L 2924/00011 (2013.01); H01L 2924/01004 (2013.01); H01L 2924/014 (2013.01); H01L 2924/01005 (2013.01); H01L 2924/0105 (2013.01); H01L 2924/01006 (2013.01); H01L 2924/01011 (2013.01); H01L 2924/01013 (2013.01); H01L 2924/01014 (2013.01); H01L 2924/01015 (2013.01); H01L 2924/01018 (2013.01); H01L 2924/01019 (2013.01); H01L 2924/01022 (2013.01); H01L 2924/01025 (2013.01); H01L 2924/01028 (2013.01); H01L 2924/01029 (2013.01); H01L 2924/01033 (2013.01); H01L 2924/01042 (2013.01); H01L 2924/01045 (2013.01); H01L 2924/01046 (2013.01); H01L 2924/01047 (2013.01); H01L 2924/01061 (2013.01); H01L 2924/01065 (2013.01); H01L 2924/01073 (2013.01); H01L 2924/01074 (2013.01); H01L 2924/01075 (2013.01); H01L 2924/01078 (2013.01); H01L 2924/01079 (2013.01); H01L 2924/01082 (2013.01); H01L 2924/01327 (2013.01); H01L 2924/04941 (2013.01); H01L 2924/04953 (2013.01); H01L 2924/05042 (2013.01); H01L 2924/078 (2013.01); H01L 2924/09701 (2013.01); H01L 2924/10253 (2013.01); H01L 2924/12042 (2013.01); H01L 2924/1306 (2013.01); H01L 2924/13091 (2013.01); H01L 2924/14 (2013.01); H01L 2924/15311 (2013.01); H01L 2924/15787 (2013.01); H01L 2924/15788 (2013.01); H01L 2924/181 (2013.01); H01L 2924/19041 (2013.01); H01L 2924/19043 (2013.01)

(56) References Cited

U.S. PATENT DOCUMENTS

| | | | |
|---|---|---|---|
| 6,384,486 | B2 | 5/2002 | Zuniga et al. |
| 6,534,863 | B2 | 3/2003 | Walker et al. |
| 6,798,050 | B1 | 9/2004 | Homma et al. |
| 2001/0008311 | A1* | 7/2001 | Harada et al. ............... 257/758 |
| 2002/0044580 | A1* | 4/2002 | Ohkubo et al. ............... 372/43 |
| 2002/0056901 | A1 | 5/2002 | Ono et al. |
| 2002/0125584 | A1* | 9/2002 | Umehara et al. ............ 257/786 |
| 2002/0190395 | A1* | 12/2002 | Fang et al. .................... 257/784 |
| 2004/0222520 | A1 | 11/2004 | Jin |
| 2005/0001314 | A1 | 1/2005 | Tanaka et al. |
| 2005/0173791 | A1* | 8/2005 | Hsu et al. ..................... 257/696 |
| 2005/0277283 | A1* | 12/2005 | Lin et al. ...................... 438/618 |
| 2006/0214296 | A1* | 9/2006 | Okamoto et al. ............ 257/751 |
| 2009/0242268 | A1* | 10/2009 | Fukuda ......................... 174/527 |
| 2013/0313708 | A1 | 11/2013 | Shigihara et al. |

FOREIGN PATENT DOCUMENTS

| | | | |
|---|---|---|---|
| JP | 08-330310 | 12/1996 | |
| JP | 08330310 A | * 12/1996 | ........... H01L 21/321 |
| JP | 2000-164623 | 6/2000 | |
| JP | 2000-183104 | 6/2000 | |
| JP | 2001-093928 A | 4/2001 | |
| JP | 2001-308139 | 11/2001 | |
| JP | 2003-068738 A | 3/2003 | |
| JP | 2004-533711 | 11/2004 | |
| JP | 2005-019493 A | 1/2005 | |

(56) References Cited

FOREIGN PATENT DOCUMENTS

| JP | 2005-527968 | 9/2005 |
|---|---|---|
| WO | 03/079437 A2 | 9/2003 |

OTHER PUBLICATIONS

Wikipedia—Solder [online]. May 17, 2011. Retrieved from the Internet <URL: http://en.wikipedia.org/wiki/Solder>.
Office Action issued Mar. 21, 2013, in Japanese Patent Application No. 2009-188913.
Office Action issued Mar. 8, 2013, in Chinese Patent Application No. 200910224397.1.
Office Action issued Oct. 12, 2013, in Chinese Patent Application No. 200910224397.1.
Office Action issued Jul. 31, 2014, in Japanese Patent Application No. 2013-156382.
Office Action issued Mar. 5, 2015, in Japanese Patent Application No. 2013-156382.
Office Action issued Jul. 2, 2015, in Japanese Patent Application No. 2014-193557.
Office Action, issued Dec. 18, 2015, in Chinese Patent Application No. 201310725962.9.

* cited by examiner

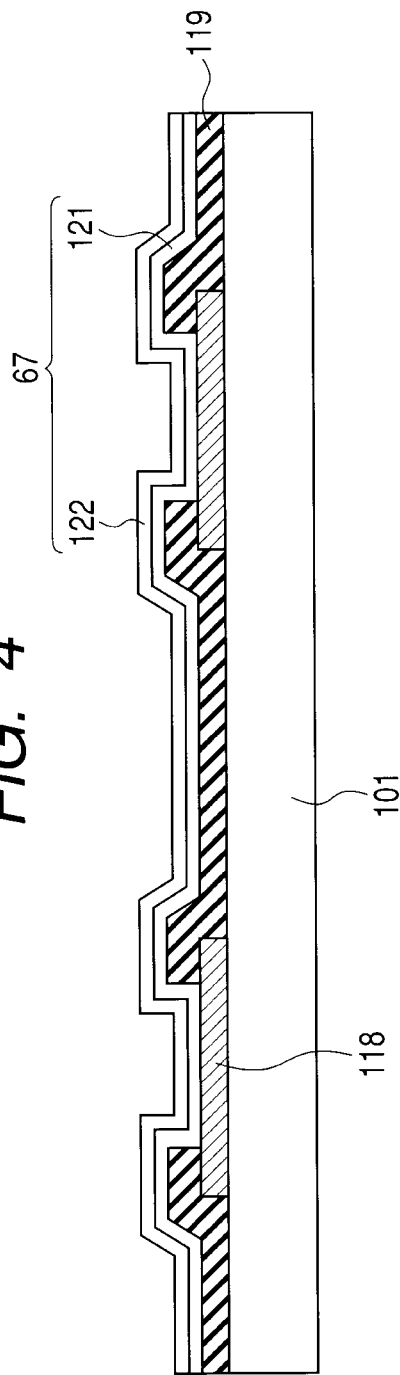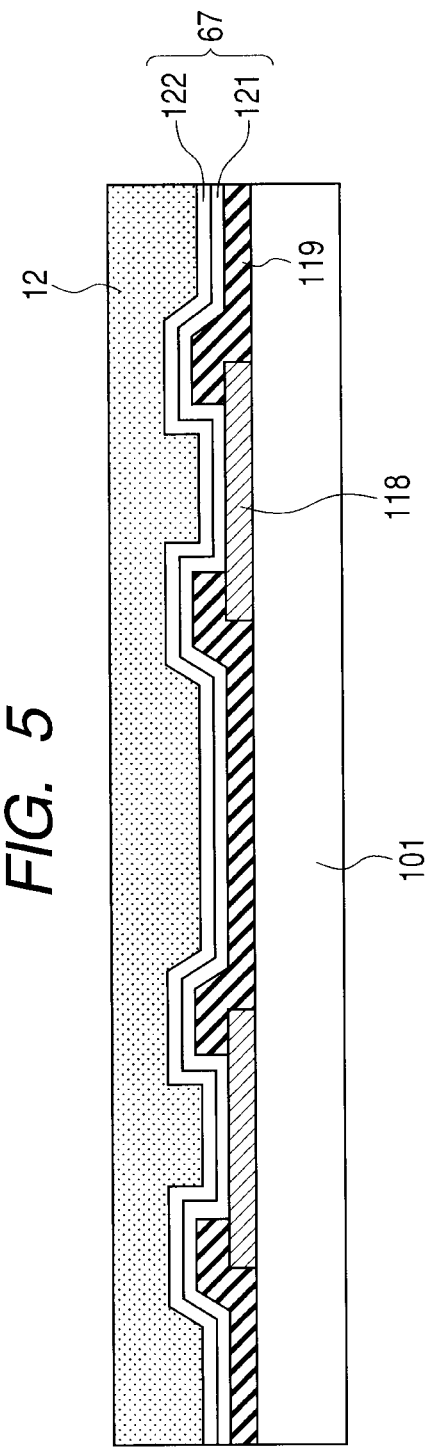

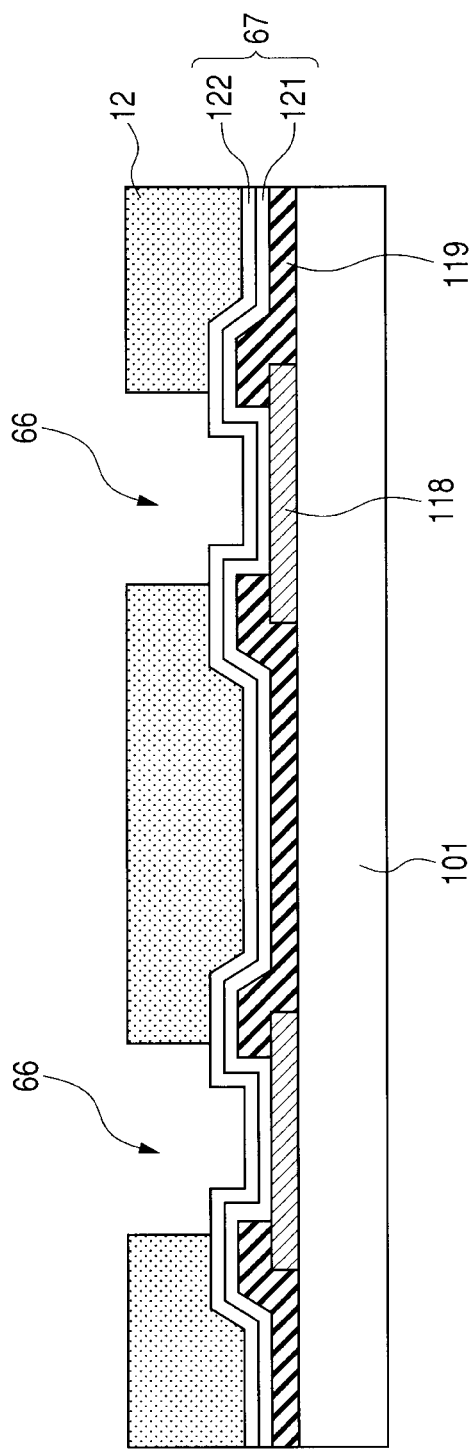

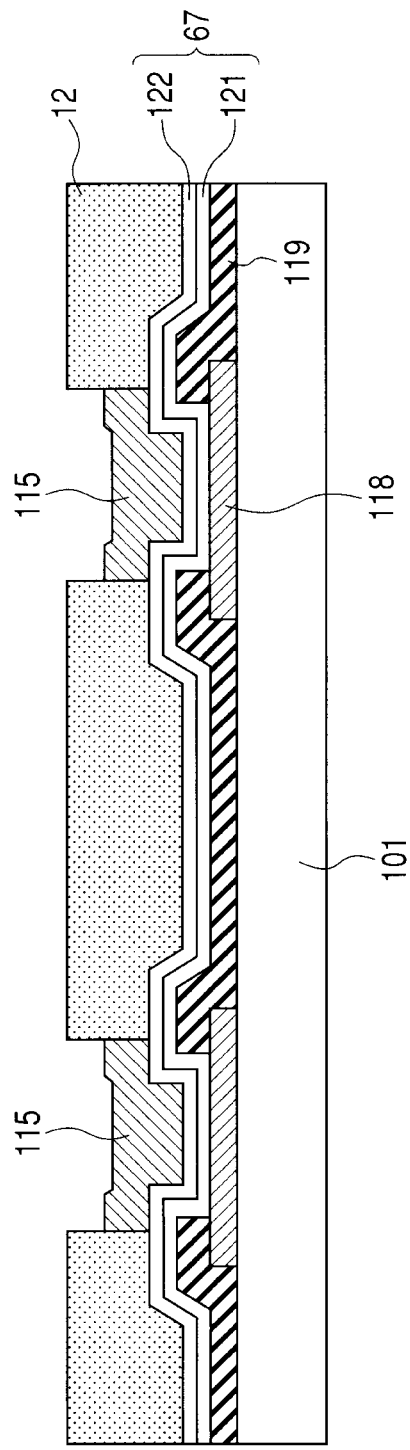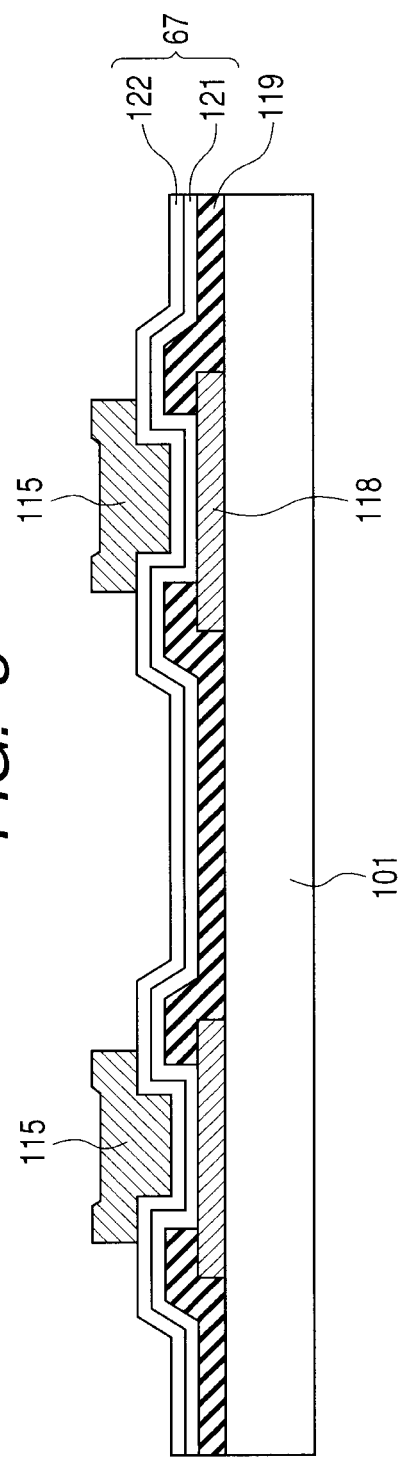

SEMICONDUCTOR INTEGRATED CIRCUIT DEVICE

CROSS-REFERENCE TO RELATED APPLICATIONS

This application is a division of application Ser. No. 12/628,869 filed Dec. 1, 2009 now U.S. Pat. No. 8,063,489. Also, the disclosure of Japanese Patent Application No. 2008-308585 filed on Dec. 3, 2008 and Japanese Patent Application No. 2009-188913 filed on Aug. 18, 2009 each including the specification, drawings and abstract are incorporated herein by reference in its entirety.

BACKGROUND OF THE INVENTION

The present invention relates to a technique effectively applied to interconnection technology between a pad electrode on a semiconductor chip in a semiconductor integrated circuit device (semiconductor device or electronic circuit device) and an external device.

Published Japanese translation of a PCT application No. 2004-533711 (Patent Document 1) or U.S. Pat. No. 6,534,863 (Patent Document 2) discloses a technique for bonding a gold wire to a pad comprised of a TaN (bonding layer)/Ta (barrier layer)/Cu (seed layer)/Ni (first electroplated layer)/Au (second electroplated layer), or the like from the lower layer side, instead of an aluminum pad whose surface tends to be easily oxidized, in a semiconductor device with a copper wiring structure.

RELATED ART DOCUMENTS

Patent Documents

[Patent Document 1]
Published Japanese translation of a PCT application No. 2004-533711
[Patent Document 2]
U.S. Pat. No. 6,534,863

SUMMARY OF THE INVENTION

In semiconductor circuit devices for vehicle use or the like, an aluminum pad on a semiconductor chip and an external device are generally coupled to each other by wire bonding or the like using a gold wire and the like for the convenience of mounting. Such a semiconductor integrated circuit device, however, causes connection failure, such as Kirkendall Void, due to the interaction between aluminum and gold in use for a long time at a relatively high temperature (about 150 degrees. C).

The invention of the present application is to solve the forgoing problems.

It is an object of the invention to provide a semiconductor integrated circuit device with high reliability.

The above, other objects, and novel features of the invention will become apparent from the description of the present specification with reference to the accompanying drawings.

The following briefly describes the summary of representative embodiments of the invention disclosed in the present application.

That is, in the invention of the present application, a gold-based surface metal layer is provided over an aluminum or copper-based bonding pad on a semiconductor chip via a barrier metal film. The bonding pad is a part of a semiconductor integrated circuit device (semiconductor device or electron circuit device). And a gold or copper-based bonding wire connection portion or bonding ball is provided for connection to an external portion.

The effects obtained by the representative embodiments of the invention disclosed in the present application will be briefly described in the following.

That is, since the gold or copper-based bonding wire or bonding ball is bonded to the aluminum or copper-based bonding pad via the gold-based surface film or layer, even the use of the semiconductor integrated circuit device for a long time at a relatively high temperature does not cause the failure of connection due to the interaction between gold and aluminum or the like.

BRIEF DESCRIPTION OF THE DRAWINGS

FIG. 4 is a process flowchart showing a device section (in a barrier film formation step) of the semiconductor chip (corresponding to a section taken along the line X-X' of FIG. 19) of the semiconductor integrated circuit device in the embodiment of the present application, FIG. 5 is a process flowchart showing a device section (in a resist film application step) of the semiconductor chip (corresponding to a section taken along the line X-X' of FIG. 20) of the semiconductor integrated circuit device in the embodiment of the present application, FIG. 6 is a process flowchart showing a device section (in a resist film opening step) of the semiconductor chip (corresponding to a section taken along the line X-X' of FIG. 21) of the semiconductor integrated circuit device in the embodiment of the present application, FIG. 7 is a process flowchart showing a device section (in a gold plating step) of the semiconductor chip (corresponding to a section taken along the line X-X' of FIG. 22) of the semiconductor integrated circuit device in the embodiment of the present application, FIG. 8 is a process flowchart showing a device section (in a resist removal step) of the semiconductor chip (corresponding to a section taken along the line X-X' of FIG. 23) of the semiconductor integrated circuit device in the embodiment of the present application.

DETAILED DESCRIPTION OF THE PREFERRED EMBODIMENTS

Summary of Preferred Embodiments

Figure 1:
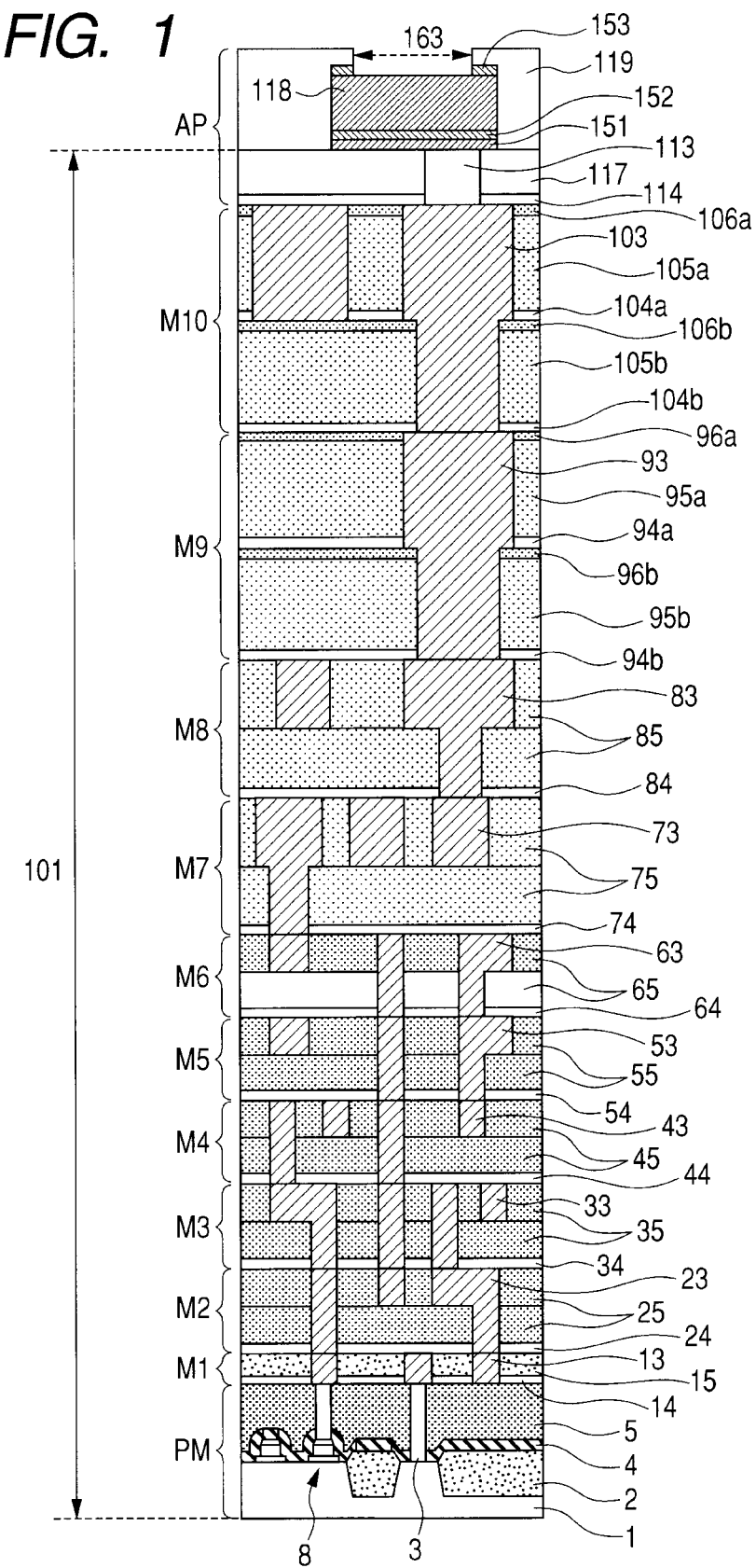
FIG. 1 is a longitudinal device structural diagram (corresponding to a part enclosed by a broken line shown in FIG. 3) of a semiconductor chip in a semiconductor integrated circuit device at the time of completion of a pad opening step according to one embodiment of the present application.

First, representative preferred embodiments of the invention disclosed in the present application will be summarized below.

1. A semiconductor integrated circuit device includes: (a) an aluminum or copper-based pad electrode provided over a device surface of a semiconductor chip; (b) a barrier metal film provided over the pad electrode; (c) a surface metal film provided over the barrier metal film, and including gold as a principal component; and (d) a bonding ball or bonding wire bonded to the surface metal film, and including gold or copper as a principal component.

2. In the semiconductor integrated circuit device according to Item 1, a thickness of the surface metal film is larger than that of the barrier metal film.

3. In the semiconductor integrated circuit device according to Item 1 or 2, the surface metal film is formed by electrolytic plating or sputtering.

4. In the semiconductor integrated circuit device according to any one of Items 1 to 3, the surface metal film is formed by the electrolytic plating.

5. In the semiconductor integrated circuit device according to any one of Items 1 to 4, an area of the surface metal film is larger than that of an opening of an insulating film over the pad electrode.

6. In the semiconductor integrated circuit device according to any one of Items 1 to 5, an area of the pad electrode is larger than that of the surface metal film.

7. In the semiconductor integrated circuit device according to any one of Items 1 to 6, the opening of the insulating film over the pad electrode is located within the surface metal film as viewed planarly.

8. The semiconductor integrated circuit device according to any one of Items 1 to 7, the surface metal film is located within the pad electrode as viewed planarly.

9. The semiconductor integrated circuit device according to any one of Items 1 to 4, the surface metal film extends up to an area without the pad electrode.

10. In the semiconductor integrated circuit device according to any one of Items 1 to 9, the bonding ball is a ball portion of a bonding wire.

11. In the semiconductor integrated circuit device according to any one of Items 1 to 10, the bonding ball is comprised of a member including gold as a principal component.

12. In the semiconductor integrated circuit device according to any one of Items 1 to 10, the bonding ball is comprised of a member including copper as a principal component.

13. In the semiconductor integrated circuit device according to any one of Items 1 to 12, the pad electrode is an aluminum or copper-based pad electrode.

14. In the semiconductor integrated circuit device according to any one of Items 1 to 13, the barrier metal film includes titanium as a principal component.

15. In the semiconductor integrated circuit device according to any one of Items 1 to 13, the barrier metal film includes one selected from the group comprising titanium, chrome, titanium nitride, and tungsten nitride as a principal component.

16. The semiconductor integrated circuit device according to any one of Items 1 to 15 further includes (e) a seed metal film provided between the barrier metal film and the surface metal film.

17. In the semiconductor integrated circuit device according to item 16, the seed metal film includes palladium as a principal component.

18. In the semiconductor integrated circuit device according to item 16, the seed metal film includes one selected from the group comprising copper, gold, nickel, platinum, rhodium, molybdenum, tungsten, chrome, and tantalum.

19. In the semiconductor integrated circuit device according to any one of Items 1 to 18, the pad electrode has a substantially square shape as viewed planarly.

20. In the semiconductor integrated circuit device according to any one of Items 1 to 18, the pad electrode has a substantially rectangular shape as viewed planarly.

Next, other preferred embodiments of the invention disclosed in the present application will be summarized below.

1. A semiconductor integrated circuit device includes: (a) a wiring board; (b) a first semiconductor chip fixed to the wiring board or to a first electronic element provided over the wiring board; (c) an aluminum or copper-based pad electrode provided over a device surface of the first semiconductor chip; (d) a barrier metal film provided over the pad electrode; (e) a seed metal film provided over the barrier metal film; (f) a surface metal film provided over the seed metal film by electrolytic plating and including gold as a principal component; (g) an external metal electrode provided outside the first semiconductor chip; and (h) a bonding wire provided for coupling the surface metal film to the external metal electrode, and including gold as a principal component.

2. In the semiconductor integrated circuit device according to Item 1, the pad electrode is an aluminum-based pad electrode.

3. In the semiconductor integrated circuit device according to Item 1 or 2, the barrier metal film includes titanium as a principal component.

4. In the semiconductor integrated circuit device according to any one of Items 1 to 3, the seed metal film includes palladium as a principal component.

5. In the semiconductor integrated circuit device according to any one of Items 1, 2, and 4, the barrier metal film includes one selected from the group comprising titanium, chrome, titanium nitride, and tungsten nitride.

6. In the semiconductor integrated circuit device according to any one of Items 1 to 3, and 5, the seed metal film includes one selected from the group comprising copper, gold, nickel, platinum, rhodium, molybdenum, tungsten, chromium, and tantalum as a principal component.

7. In the semiconductor integrated circuit device according to any one of Items 1 to 6, the first semiconductor chip is fixed to the wiring board.

8. In the semiconductor integrated circuit device according to any one of Items 1 to 6, the first semiconductor chip is fixed to the first electronic element over the wiring board.

9. In the semiconductor integrated circuit device according to any one of Items 1 to 8, the external metal electrode is located over the wiring board.

10. In the semiconductor integrated circuit device according to any one of Items 1 to 8, the external metal electrode is located over the first electronic element located over the wiring board.

11. In the semiconductor integrated circuit device according to any one of Items 1 to 10, the bonding wire has a first bonding point located on the surface metal film side.

12. In the semiconductor integrated circuit device according to any one of Items 1 to 10, the bonding wire has a second bonding point located on the surface metal film side.

13. In the semiconductor integrated circuit device according to any one of Items 1 to 12, a metal film including gold, silver, or palladium as a principal component is provided at a surface of the external metal electrode.

14. A method for manufacturing a semiconductor integrated circuit device is provided. The semiconductor integrated circuit device includes: (a) a wiring board; (b) a first semiconductor chip fixed to the wiring board or to a first electronic element provided over the wiring board; (c) an aluminum or copper-based pad electrode provided over a device surface of the first semiconductor chip; (d) a barrier metal film provided over the pad electrode; (e) a seed metal film provided over the barrier metal film; (f) a surface metal film provided over the seed metal film and including gold as a principal component; (g) an external metal electrode provided outside the first semiconductor chip; and (h) a bonding wire provided for coupling the surface metal film and the external metal electrode to each other, and including gold as a principal component. The method includes the steps of: (I) forming the seed metal film over the substantially entire surface of a semiconductor wafer; (II) forming a resist film with an opening over the seed metal film; and (III) forming the surface metal film by forming a plated layer at the opening by electrolytic plating.

Further, other preferred embodiments of the invention disclosed in the present application will be summarized below.

1. A semiconductor integrated circuit device includes: (a) an aluminum or copper-based pad electrode provided over a device surface of a semiconductor chip; (b) a barrier metal film provided over the pad electrode; (c) a surface metal film provided over the barrier metal film by electrolytic plating, and including gold as a principal component; and (d) a bonding ball, or bonding wire provided over the surface metal film and including gold or copper as a principal component.

2. In the semiconductor integrated circuit device according to Item 1, the pad electrode is an aluminum-based pad electrode.

3. In the semiconductor integrated circuit device according to Item 1 or 2, the barrier metal film includes titanium as a principal component.

4. The semiconductor integrated circuit device according to any one of Items 1 to 3 further includes: (e) a seed metal film provided between the barrier metal film and the surface metal film.

5. In the semiconductor integrated circuit device according to Item 4, the seed metal film includes palladium as a principal component.

6. In the semiconductor integrated circuit device according to any one of Items 1, 2, 4, and 5, the barrier metal film includes one selected from the group comprising titanium, chrome, titanium nitride, and tungsten nitride as a principal component.

7. In the semiconductor integrated circuit device according to Item 4 or 6, the seed metal film includes one selected from the group comprising copper, gold, nickel, platinum, rhodium, molybdenum, tungsten, chromium, and tantalum as a principal component.

[Explanation of Description Format, Basic Terms, and Usage in Present Application]

1. The description of the following preferred embodiments in the present application may be divided into sections for convenience if necessary, but these embodiments are not separated from each other independently except when specified otherwise. One of the embodiments has relationships with respect to the other, including each part of a corresponding single example, a detailed description of a part of the other, and a modified example or the like of a part or all of the other. The repeated description of the same part will be omitted in principle. Further, each component of the embodiments is not essential except when specified otherwise, except when limited to the specific number of the components in theory, and except when clearly defined otherwise by the context.

Further, the term "semiconductor integrated circuit device" as used in the present application means a device mainly including various kinds of transistors (active elements), such as a resistor or a capacitor, integrated on a semiconductor chip or the like (for example, a monocrystalline silicon substrate). Various types of representative transistors can include, for example, a metal insulator semiconductor field effect transistor (MISFET), typified by a metal oxide semiconductor field effect transistor (MOSFET). At this time, the typical integrated circuit structure can include, for example, a complementary metal insulator semiconductor (CMIS) type integrated circuit, typified by a complementary metal oxide semiconductor type integrated circuit with a combination of an N-channel type MISFET and a P-channel type MISFET.

A wafer process of a modern semiconductor integrated circuit device, that is, a large scale integration (LSI), can be normally classified broadly into a front end of line (FEOL) process and a back end of line (BEOL) process. The FEOL process involves a delivery process of a silicon wafer as raw material, and a premetal process (including formation of an interlayer insulating film between a lower end of a M1 wiring layer and a gate electrode structure, formation of contact holes, formation of a tungsten plug, embedding, and the like). The BEOL process involves a formation process of the M1 wiring layer, and a formation process of a pad opening in a final passivation film on the aluminum-based pad electrode (which may also include a wafer level package process). The gate electrode patterning process and the contact hole formation process among the FEOL process are a microfabrication process which requires a very fine process. In contrast, in the BEOL process, a via and trench formation process, especially, the formation of local wiring at a relatively low layer (for example, fine embedded wiring layers from M1 to M3 in the case of an embedded wiring structure with a four-layered structure, or those from M1 to M5 in the case of an embedded wiring structure with ten layers), or the like requires a very fine process. It is noted that "MN (normally, N ranging from about 1 to 15 (N=1 to 15)" represents an N-th wiring layer counted from the lower side. The reference character M1 represents a first wiring layer, and the reference character M3 represents a third wiring layer.

2. Likewise, in the description of the embodiments and the like, the phrase "X made of A" about material, component, or the like does not exclude a member containing an element other than A as a principal component, except when specified otherwise, and except when indicated from the context. For example, as to a component, the above phrase means "X containing A as a principal component" or the like. It is apparent that for example, the term "silicon member" or the like is not limited to pure silicon, and may have a member containing a multicomponent alloy including SiGe alloy or other silicon materials as a principal component, and other additives or the like. Likewise, the term "silicon oxide film", "silicon-oxide-based insulating film", or the like includes a film made of relatively pure undoped silicon dioxide. It is apparent that the above term also includes a thermally-oxidized film or CVD oxide film which is made of fluorosilicate glass (FSG), TEOS-based silicon oxide, silicon oxicarbide (SiOC), or carbon-doped silicon oxide, or organosilicate glass (OSG), phosphorus silicate glass (PSG), borophosphosilicate glass (BPSG), or the like; a coating type silicon oxide film made of spin on glass (SOG), nano-clustering silica (NSC), or the like; a silica-based Low-k insulating film (porous insulating film) made of the same member as that described above having holes;

and a composite film or the like containing the above-mentioned material as a principal component and another silicon-based insulating film.

Silicon-based insulating films generally used in the field of semiconductor devices include a silicon-nitride-based insulating film, in addition to the silicon-oxide-based insulating film. Materials belonging to such an insulating film are, for example, SiN, SiCN, SiNH, SiCNH, and the like. The term "silicon nitride" as used herein means both of SiN and SiNH except when specified otherwise. Likewise, the term "SiCN" as used herein means both of SiCN and SiCNH except when specified otherwise.

The insulating film made of SiC has properties similar to those of the insulating film made of SiN, but the insulating film made of SiON should often be classified as the silicon-oxide-based insulating film.

The silicon nitride film is used not only as an etching stopper film in a self-aligned contact (SAC) technique in many cases, but also as a stress applying film in a stress memorization technique (SMT).

Similarly, the terms "copper wiring", "aluminum wiring", "aluminum pad", "gold bump (gold surface film)", and the like mean not only a member comprised of pure material, but also a member including aluminum or gold as a principal component, that is, "copper-based wiring", "aluminum-based wiring", "aluminum-based pad", and "gold-based bump (gold-based surface metal film)", respectively. These expressions mean that a main part of the above member is comprised of such a material as the principal component. It is apparent that these expressions do not necessarily mean the entire member consisting of such a material.

The same goes for the terms "barrier metal", "seed metal", and the like.

3. Likewise, it is apparent that preferred examples of diagrams, positions, properties, and the like are described in the embodiments, but the invention is not strictly limited thereto except when specified otherwise, and except when indicated otherwise from the context.

4. Further, when referring to a specific value or quantity, the invention may have a value exceeding the specific value, or may have a value less than the specific value except when specified otherwise, except when the invention is not limited to the value in theory, and except when indicated otherwise from the context.

5. The term "wafer" generally indicates a single crystal silicon wafer over which a semiconductor integrated circuit device (note that the same goes for a semiconductor device, and an electronic device) is formed, but may include a composite wafer of an insulating substrate, such as an epitaxial wafer, an SOI wafer, or a LCD glass substrate, and a semiconductor layer or the like.

6. The term "bonding pad" as used in the present application means an aluminum-based pad or the like on which a multilayer metal structure or bump structure (including an area ranging from a barrier metal film to a surface metal film) is mainly formed. Suitable materials for the bonding pad may include a copper-based material as well as an aluminum-based material.

7. In the present application, a terminal electrode (electrode for external coupling) is formed of gold or the like by electrolytic plating or the like on a bonding pad, and has a relatively thick (as compared to a barrier metal layer or the like positioned directly below the electrode). The terminal electrode, that is, "surface metal layer", which is not an inherent bump electrode for direct coupling, is often referred to as a "gold bump", "bump electrode" or "bump electrode layer", or the like for convenience, taking into consideration similarity of shape. The inherent bump electrode normally has a thickness of about 15 μm, whereas the surface metal layer normally has a thickness of about 1 to 5 μm. In an example where an electrolytic plated layer made of copper, nickel, or the like is formed relatively thickly under a gold layer as the surface metal layer, the whole surface metal layer including these layers as parts thereof has a thickness of about 15 μm in some cases.

The term "bonding ball" in ball bonding as used herein means a ball-shaped metal core or its deformed one formed at a first bonding point, and also a ball-shaped metal core or its deformed one, such as a stud bump, formed due to a bonding wire.

8. In the present application, the term "wiring board" as used herein includes not only a general-purpose organic wiring board (monolayer and multilayer) made of glass epoxy, or the like, but also a flexible wiring board, a ceramic wiring board, a glass wiring board, and the like. The term "electronic element" on the wiring board as used herein includes a semiconductor device, a semiconductor chip, other chip components (resistor, capacitor, and the like) and the like sealed in a package.

Further Detailed Description of the Preferred Embodiments

The preferred embodiments will be further described below in detail. In each drawing, the same or similar part is designated by the same or similar reference character or numeral, and a description thereof will not be repeated in principle.

1. Explanation of Device Cross-Sectional Structure in Completion of Pad Opening Process on Aluminum-based Pad in Semiconductor Integrated Circuit Device of One Embodiment of Present Application (mainly see FIG. 1)

FIG. 1 is a device cross-sectional view (at the time of completion of a pad opening process) showing one example of a cross-sectional structure of a device of the 65 nm technology node manufactured by a manufacturing method of a semiconductor integrated circuit device in one embodiment of the invention of the present application. Based on FIG. 1, the outline of the device structure of the semiconductor integrated circuit device in the embodiment of the present application will be described below.

As shown in FIG. 1, for example, a gate electrode 8 of a P-channel MOSFET or an N-channel MOSFET is formed on a device surface of a P-type monocrystalline silicon substrate 1 isolated by a shallow trench isolation (STI) type element isolation field insulating film 2. Over these components, a silicon nitride liner film 4 (for example, of about 30 nm in thickness) is formed to serve as an etching stopper film. On the film 4, a premetal interlayer insulating film 5 is formed in a thickness much larger than that of the silicon nitride liner film 4. The insulating film 5 is comprised of an ozone TEOS silicon oxide film (for example, of about 200 nm in thickness) formed as a lower layer by a thermal CVD method, and a plasma TEOS silicon oxide film (for example, of about 270 nm in thickness) formed as an upper layer. Tungsten plugs 3 are formed through the premetal insulating film. An area up to this point is a premetal region PM.

The first wiring layer M1 thereon is comprised of an insulating barrier film 14 made of a SiCN film (for example, of about 50 nm in thickness) as a lower layer, a plasma silicon oxide film 15 as a main interlayer insulating film (for example, of about 150 nm in thickness), and copper wirings 13 or the like embedded in wiring slots formed therein.

Second to sixth wiring layers M2, M3, M4, M5, and M6 thereon have substantially the same structure to one another. Each layer is comprised of a composite insulating barrier film (liner film) 24, 34, 44, 54, or 64 made of a SiCO film (for example, of about 30 nm in thickness)/SiCN film (for example, of about 30 nm in thickness) as a lower layer, and a main interlayer insulating film 25, 35, 45, 55, or 65 occupying most of an area as an upper layer. The main interlayer insulating film 25, 35, 45, 55, or 65 is comprised of a carbon-doped silicon oxide film, that is, a SiOC film (for example, of about 350 nm) as a lower layer, and a plasma TEOS silicon oxide film (for example, of about 80 nm in thickness) as a cap film. Copper embedded wirings 23, 33, 43, 53, or 63 including a copper plug and a copper wiring are formed through the interlayer insulating films.

Seventh and eighth wiring layers M7 and M8 thereon have substantially the same structure to each other. Each layer is comprised of an insulating barrier film 74 or 84 made of a SiCN film (for example, of about 70 nm in thickness) and the like as a lower layer, and a main interlayer insulating film 75 or 85 as an upper layer. The main interlayer insulating film 75 or 85 is comprised of a plasma TEOS silicon oxide film (for example, of about 250 nm in thickness) as a lower layer, a FSG film (for example, of about 300 nm in thickness), and a USG film (for example, of about 200 nm in thickness) as a cap film. Copper embedded wirings 73 or 83 including a copper plug and a copper wiring are formed through these interlayer insulating films.

Ninth and tenth wiring layers M9 and M10 thereon have substantially the same structure to each other. Each layer is divided into an interlayer part as a lower layer and an intralayer part as an upper layer. The interlayer insulating film is comprised of an insulating barrier film 94b or 104b made of a SiCN film (for example, of about 70 nm) or the like as a lower layer, and a main interlayer insulating film or the like as an upper layer. The main interlayer insulating film is comprised of a FSG film 95b or 105b (for example, of about 800 nm in thickness) as a lower layer, and a USG film 96b or 106b (for example, of about 100 nm in thickness) or the like which is a cap film as an upper layer. The intralayer insulating film is comprised of an insulating barrier film 94a or 104a made of a SiCN film (for example, of about 50 nm in thickness) or the like as a lower layer, and a main intralayer insulating film or the like as an upper layer. The main intralayer insulating film is comprised of a FSG film 95a or 105a (for example, of about 1200 nm in thickness) as a lower layer, and a USG film 96a or 106a (for example, of about 100 nm in thickness) which is a cap film as an upper layer. Copper embedded wirings 93 or 103 including a copper plug and a copper wiring are formed through the interlayer insulating film, the intralayer insulating film, and the like.

An uppermost wiring layer (pad layer) AP thereon is comprised of an insulating barrier film made of a SiCN film 114 and the like (for example, of about 100 nm in thickness) as a lower layer, a main interlayer insulating film made of a USG film 117 (for example, of about 900 nm in thickness) as an intermediate layer, and a final passivation film or the like made of a plasma SiN 119 (for example, of about 600 nm in thickness) as an outermost part. A tungsten plug 113 is provided through the interlayer insulating films, and an aluminum-based bonding pad 118 (for example, of about 1000 nm in thickness) is provided on the USG film 117. The aluminum-based bonding pad 118 and the tungsten plug 113 are provided with a titanium adhesive layer 151 (for example, of about 10 nm in thickness) as a lower layer and a titanium nitride barrier metal layer 152 (for example, of about 30 nm in thickness) as an upper layer. A titanium nitride layer 153 (for example, of about 70 nm in thickness) is formed on the bonding pad 118, and then a bonding pad opening 163 is formed in the layer 153 and the plasma SiN film 119.

Instead of the aluminum-based bonding pad 118, a copper-based bonding pad may be used.

2. Explanation of Processes Performed After Formation of Bonding Pad Opening in Manufacturing Method of Semiconductor Integrated Circuit Device in One Embodiment of Present Application (mainly see FIG. 2, FIGS. 3 to 9, FIG. 16, FIGS. 17 to 24, and FIG. 25)

Next, the formation processes of a metal layer structure (surface metal layer, gold bump, or the like) over the bonding pad in the manufacturing method of the semiconductor integrated circuit device according to the embodiment of the invention of the present application will be described below based on FIGS. 3 to 9, and FIGS. 17 to 24.

Figure 2:
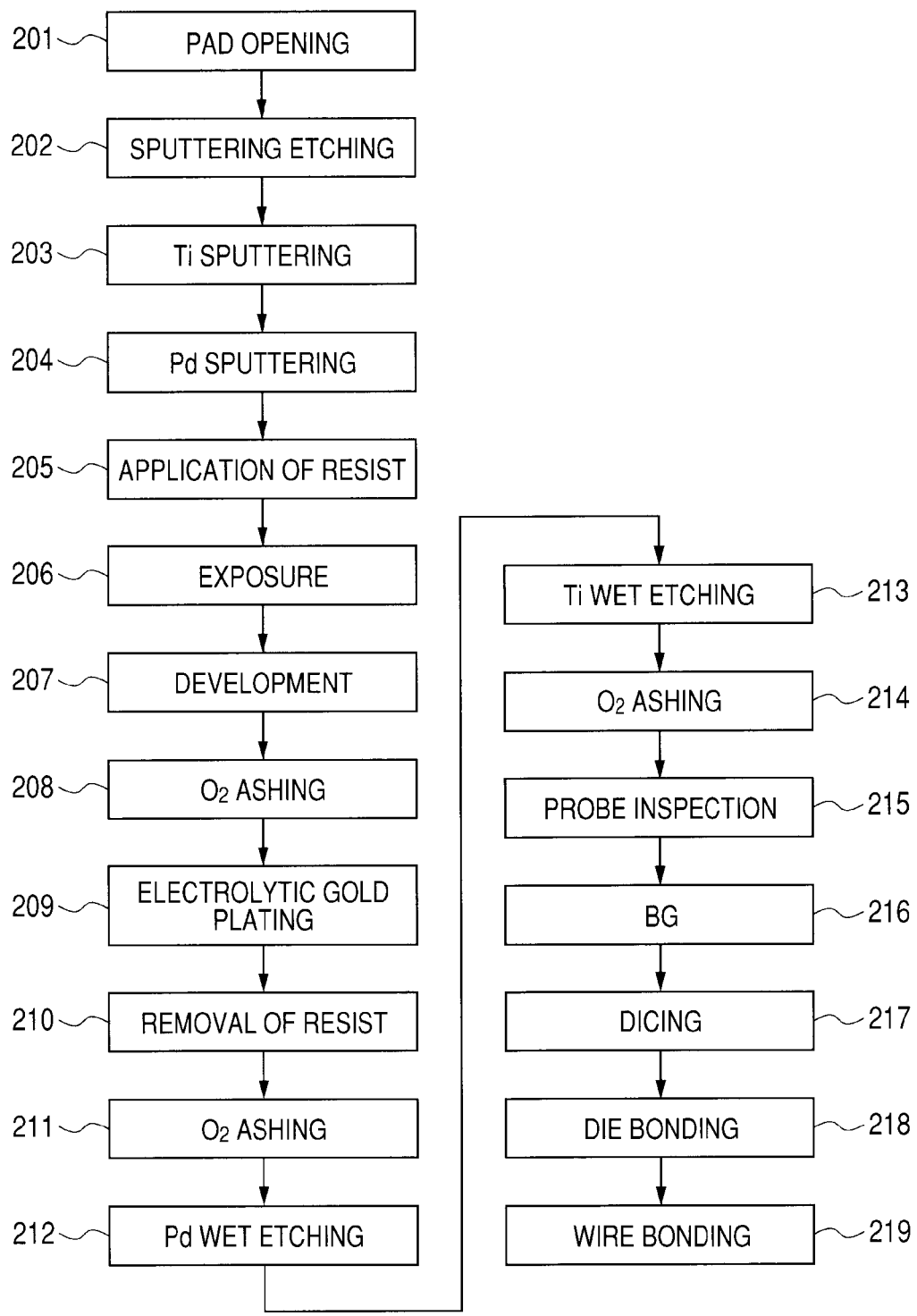
FIG. 2 is a process flowchart showing the flow from the pad opening step to a wire bonding process during a manufacturing procedure of the semiconductor integrated circuit device in the embodiment of the present application.
Figure 3:
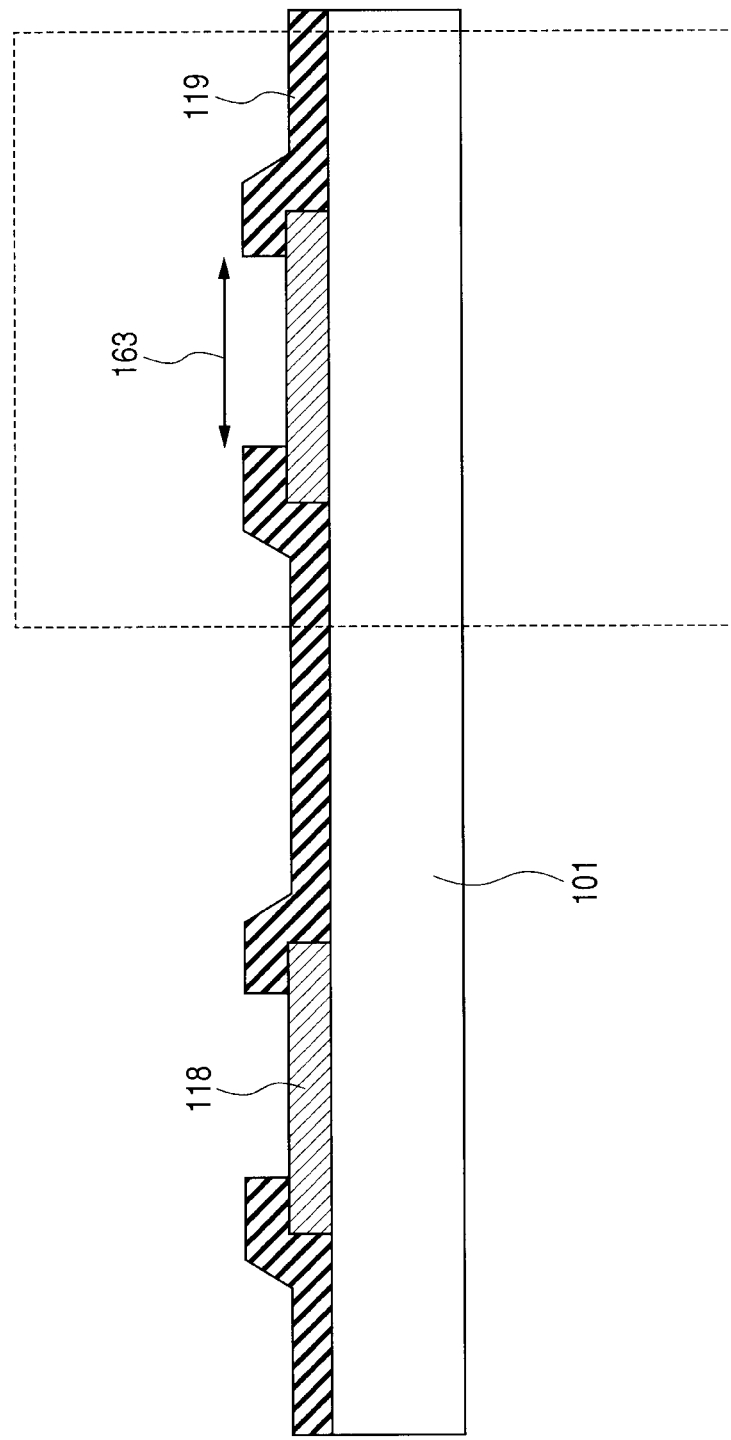
FIG. 3 is a process flowchart showing a device section (at the time of completion of the pad opening step) of the semiconductor chip (corresponding to a section taken along the line X-X' of FIG. 18) of the semiconductor integrated circuit device in the embodiment of the present application.
Figure 9:
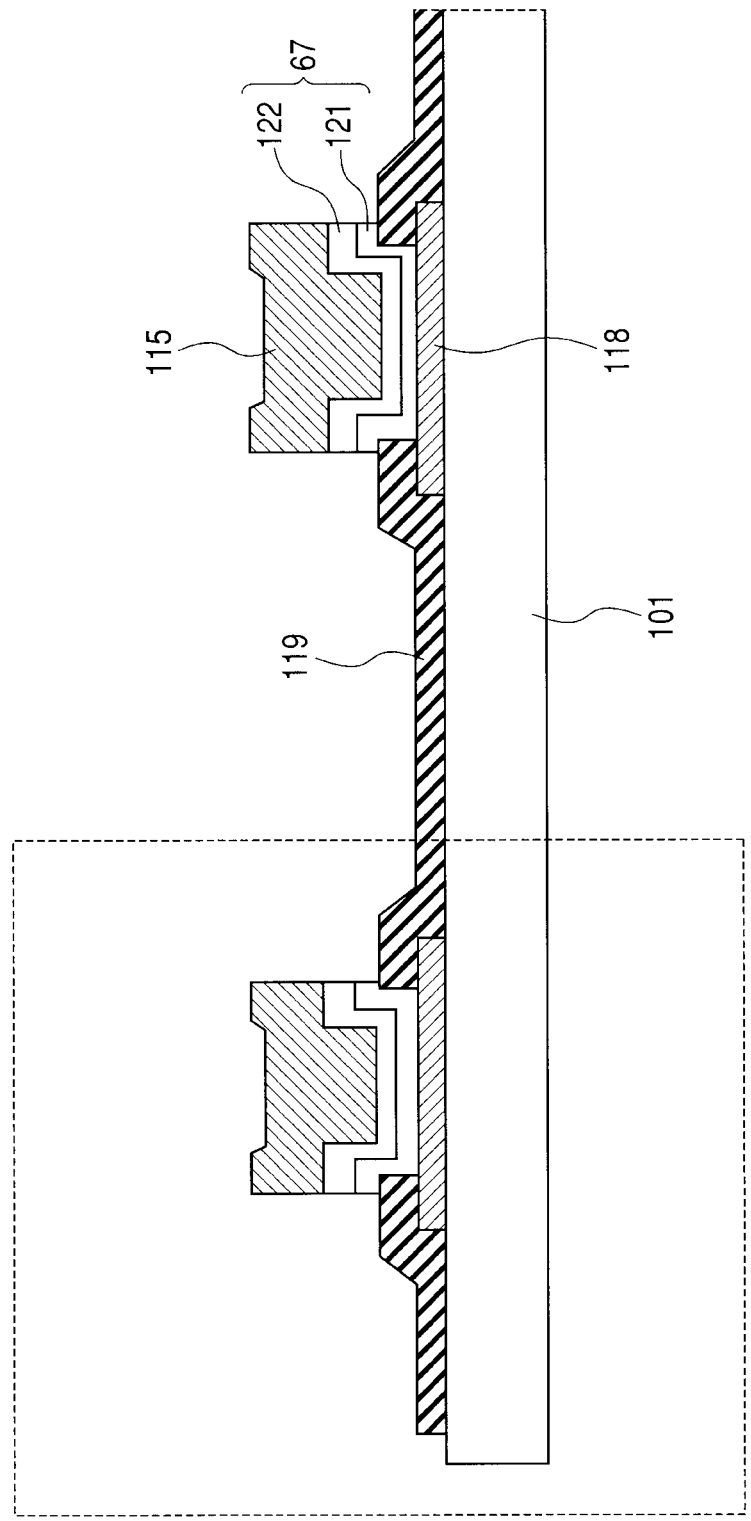
FIG. 9 is a process flowchart showing a device section (in a barrier metal removal step) of the semiconductor chip (corresponding to a section taken along the line X-X' of FIG. 24) of the semiconductor integrated circuit device in the embodiment of the present application.
Figure 10:
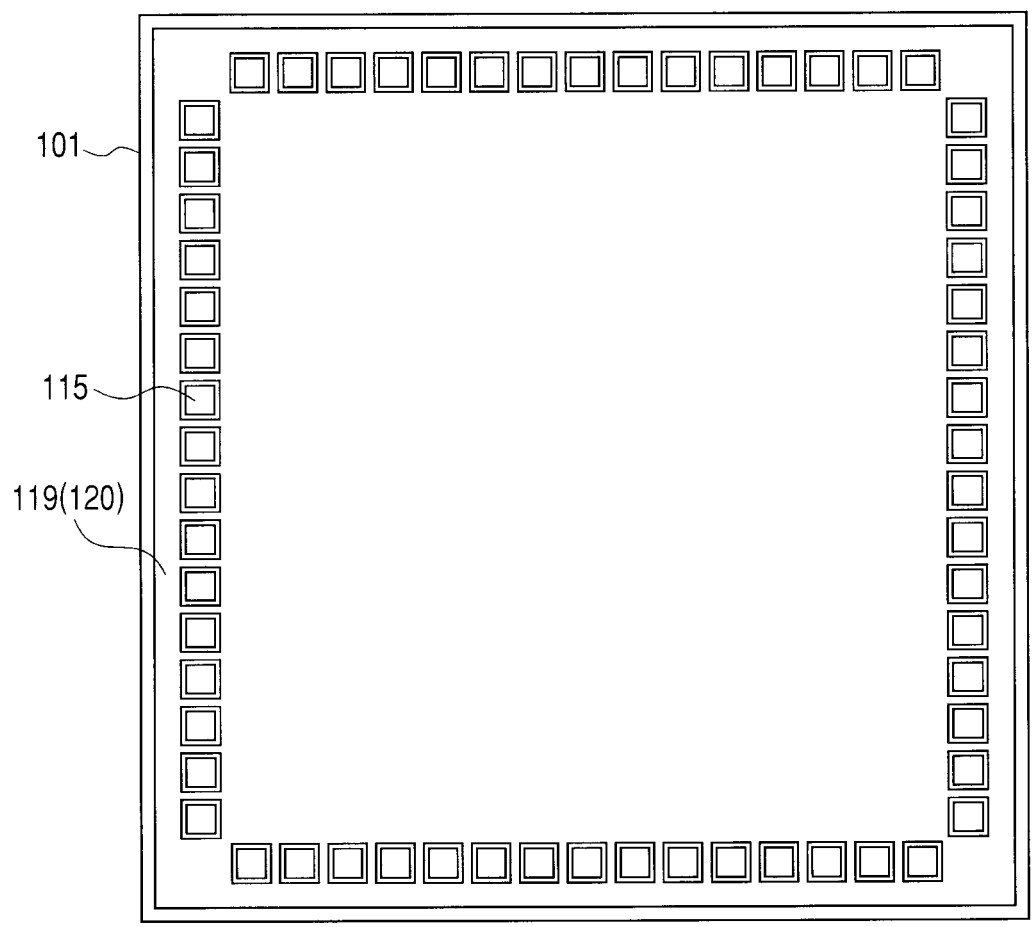
FIG. 10 is a top view of the semiconductor chip of the semiconductor integrated circuit device in the embodiment of the present application, corresponding to FIG. 9.
Figure 11:
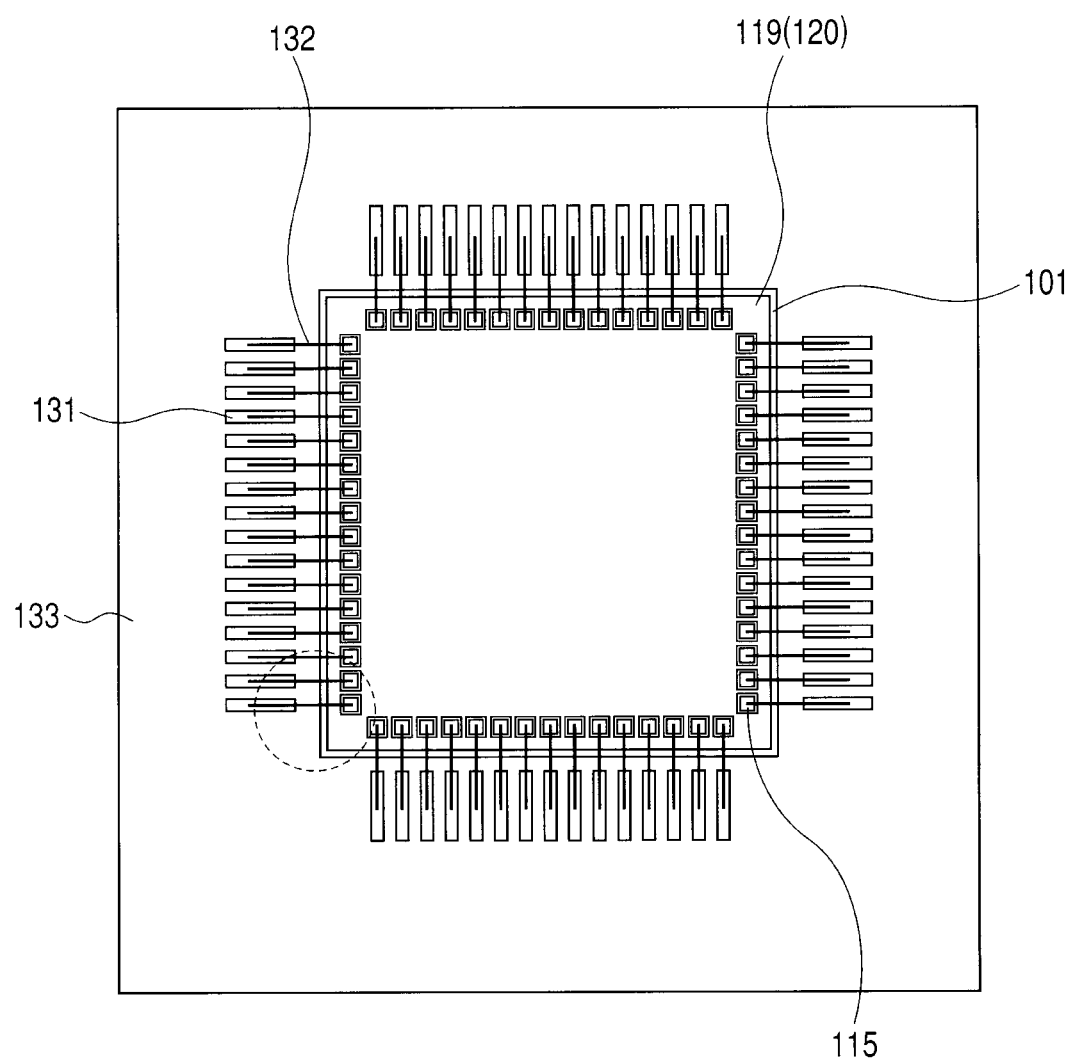
FIG. 11 is a top view of the semiconductor integrated circuit device in the embodiment of the present application.
Figure 12:
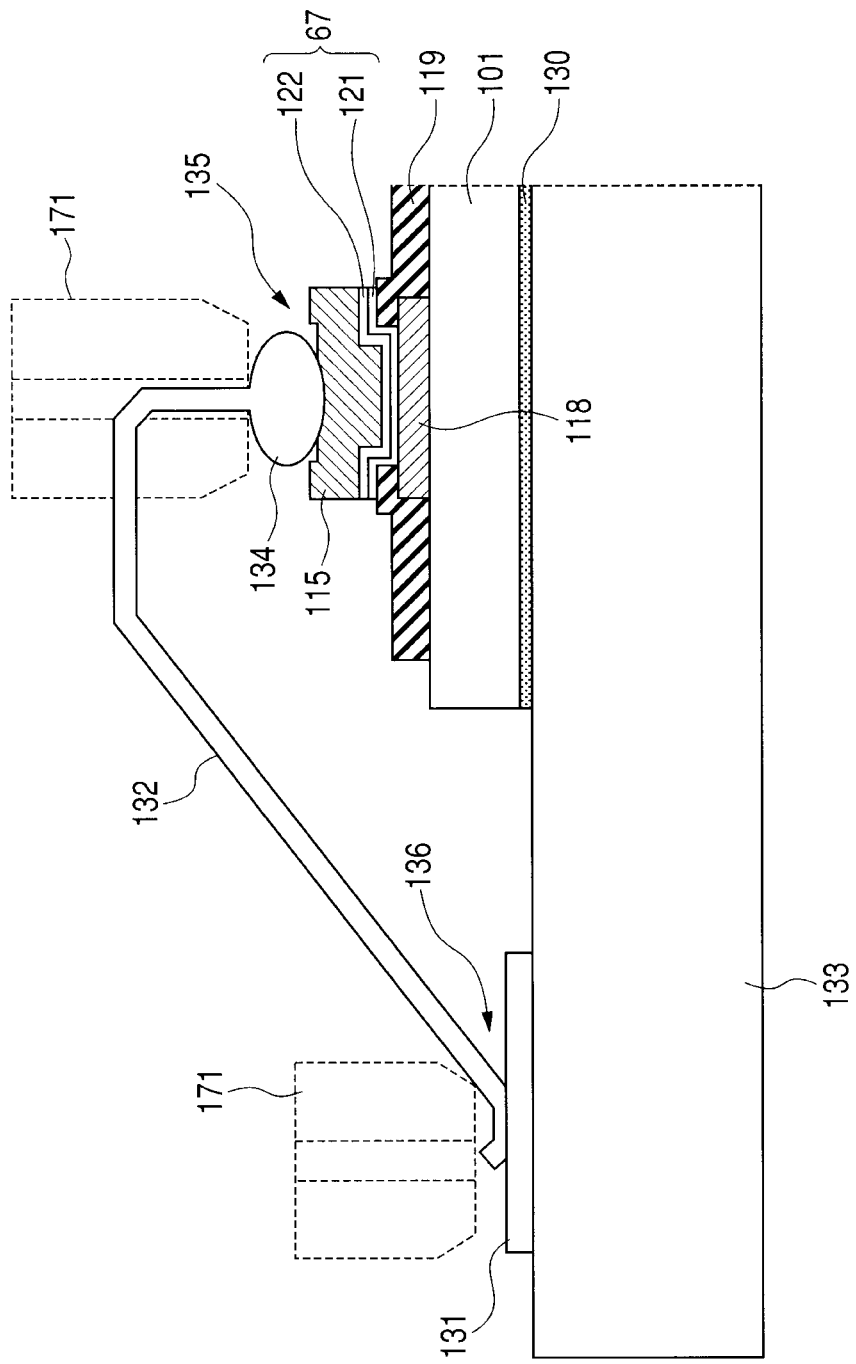
FIG. 12 is an exemplary cross-sectional view corresponding to a part enclosed by a broken line shown in FIG. 11.
Figure 13:
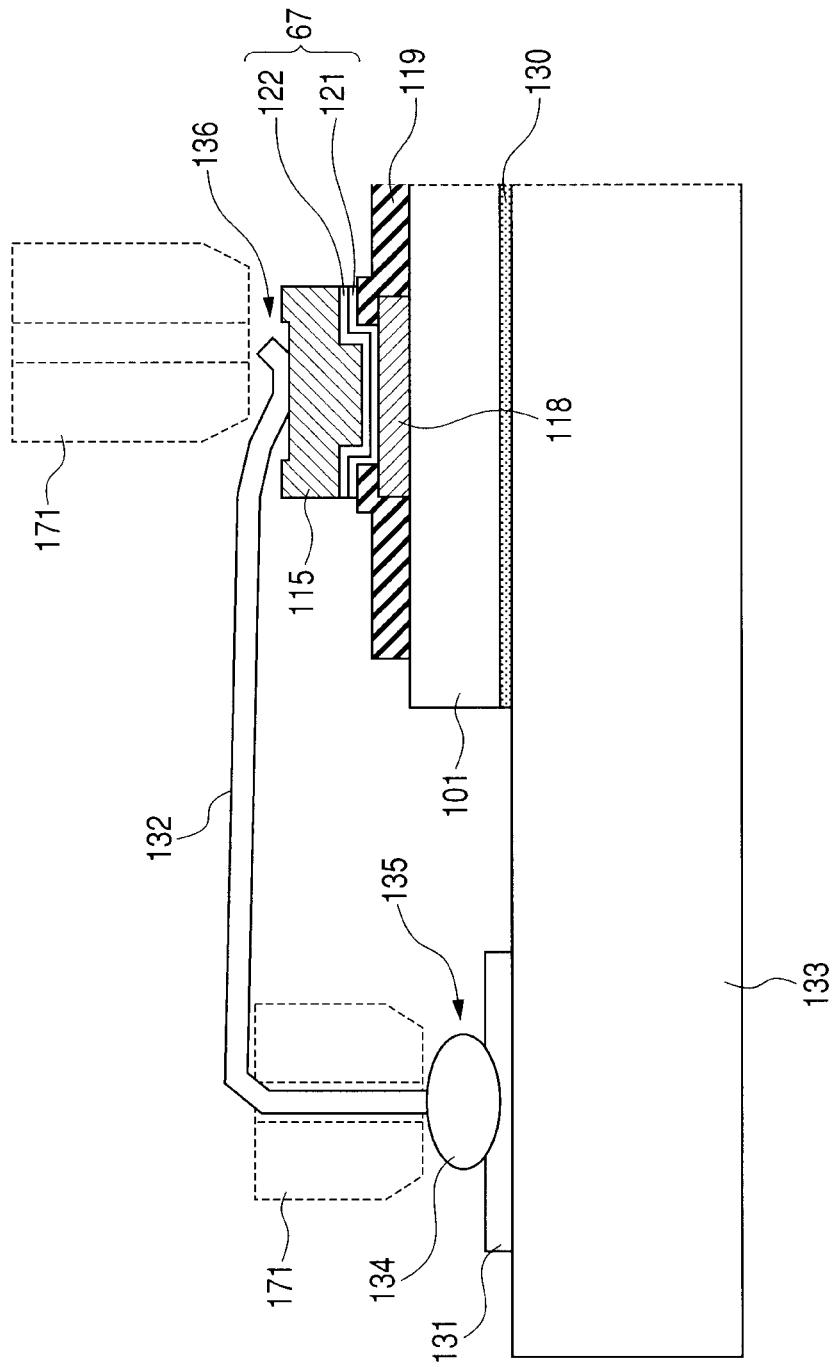
FIG. 13 is an exemplary cross-sectional view showing an example in which the order of wire bonding is changed from that in FIG. 12.
Figure 14:
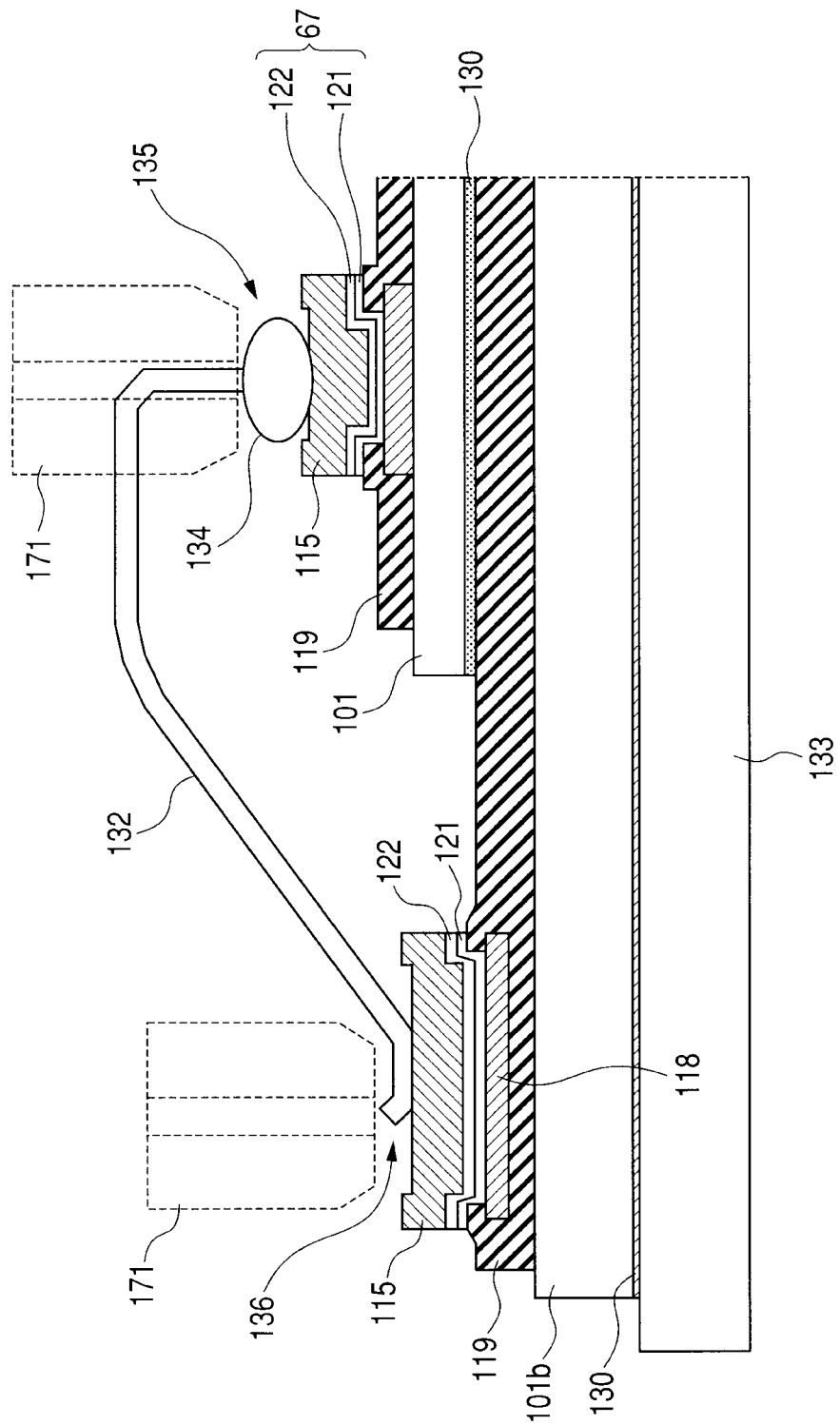
FIG. 14 is an exemplary cross-sectional view showing an example in which a wiring board is replaced by other electronic elements on the wiring board in FIG. 12.
Figure 15:
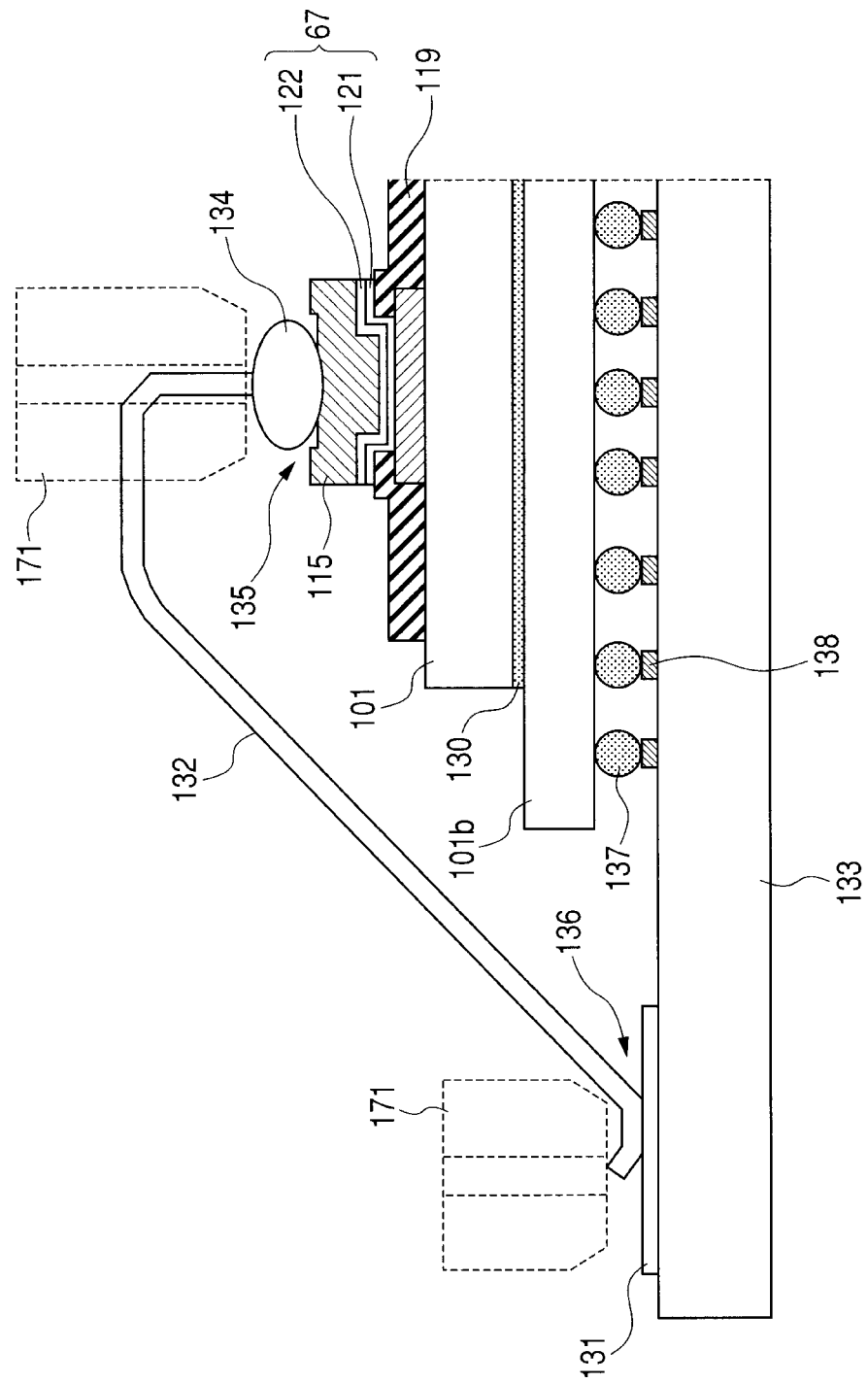
FIG. 15 is an exemplary cross-sectional view showing an example in which a target part of the semiconductor chip to be die-bonded is replaced by another electronic element (flip-chip bonded) on the wiring board in FIG. 12.
Figure 16:
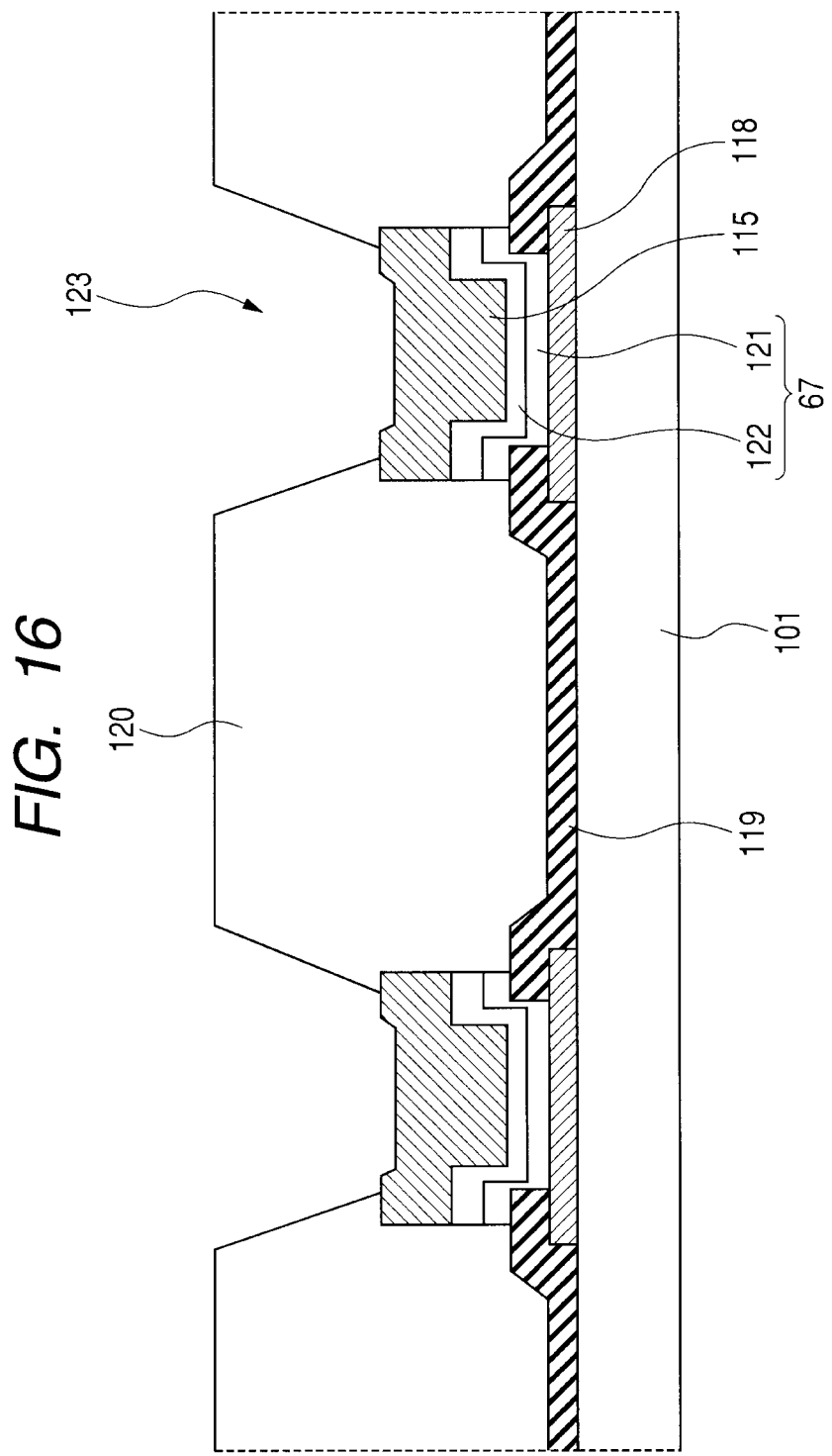
FIG. 16 is a device cross-sectional view of the semiconductor chip (at the time of completion of a wafer processing step) (corresponding to the section taken along the line X-X' of FIG. 25) of the semiconductor integrated circuit device according to another embodiment of the present application (in an example where two layered polyimide film is provided as an additional final passivation film)
Figure 17:
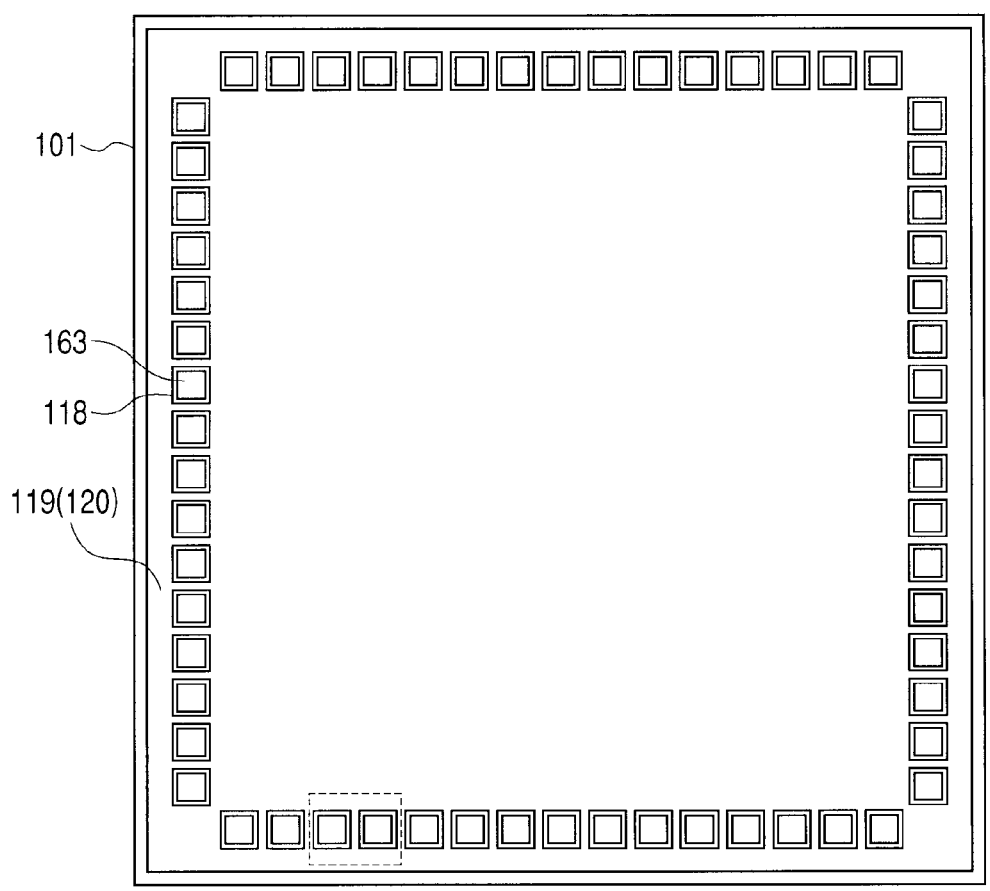
FIG. 17 is a top view of the semiconductor chip of the semiconductor integrated circuit device in the embodiment of the present application, corresponding to FIG. 3.
Figure 18:
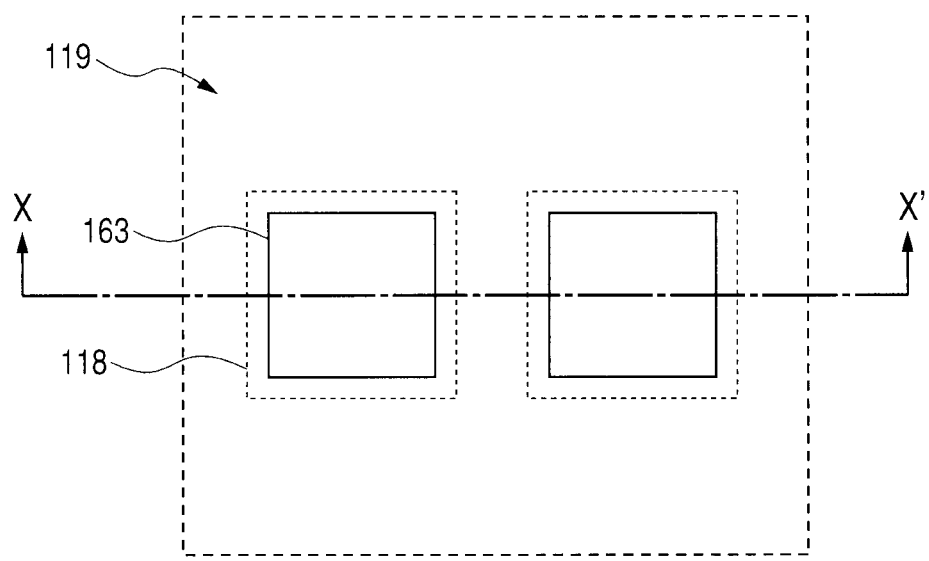
FIG. 18 is an enlarged top view (whose corresponding cross-sectional view is shown in FIG. 3) of a part enclosed by a broken line in FIG. 17.
Figure 19:
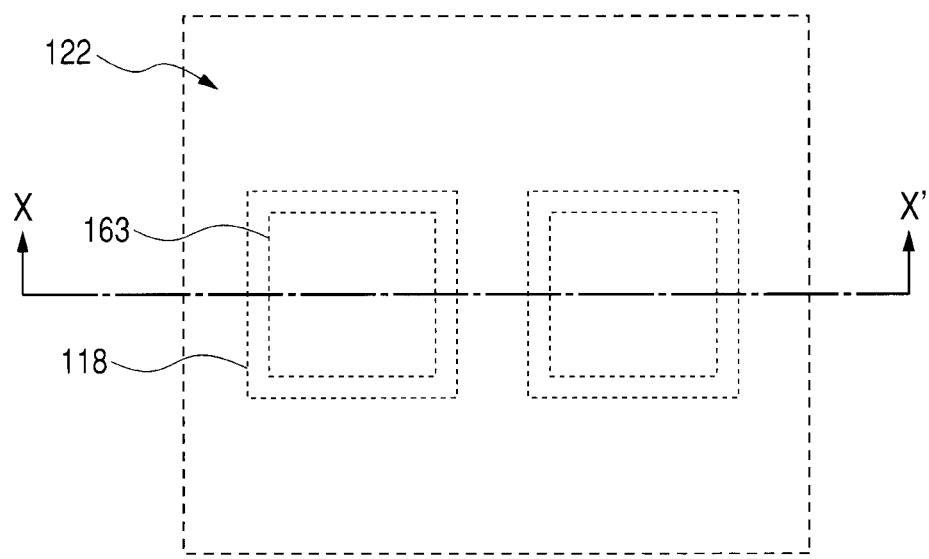
FIG. 19 is an enlarge top view of the part enclosed by the broken line in FIG. 17 in the step corresponding to FIG. 4.
Figure 20:
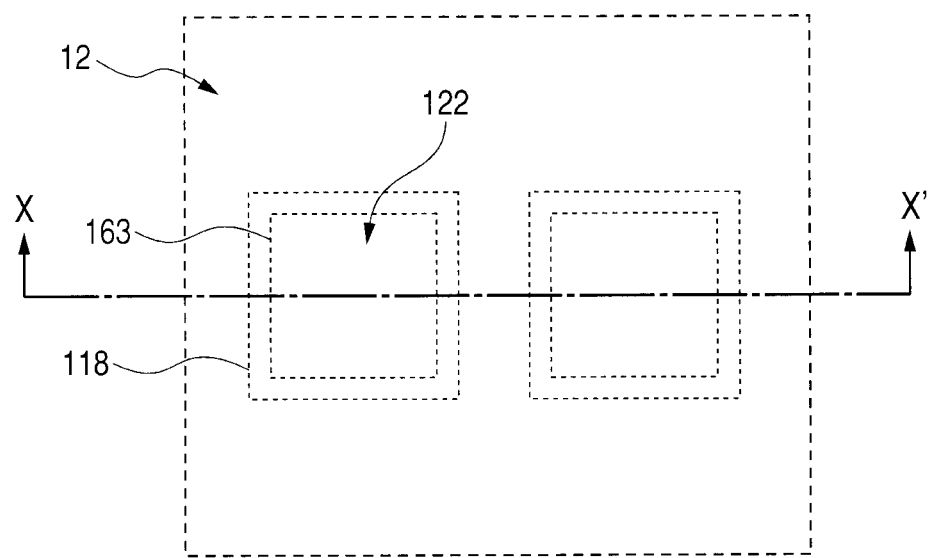
FIG. 20 is an enlarge top view of the part enclosed by the broken line in FIG. 17 in the step corresponding to FIG. 5.
Figure 21:
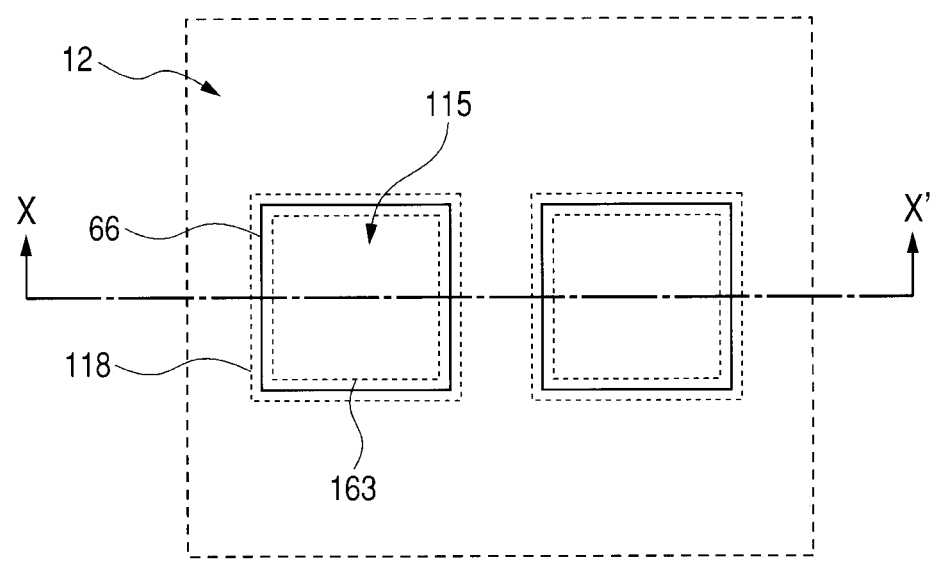
FIG. 21 is an enlarge top view of the part enclosed by the broken line in FIG. 17 in the step corresponding to FIG. 6.
Figure 22:
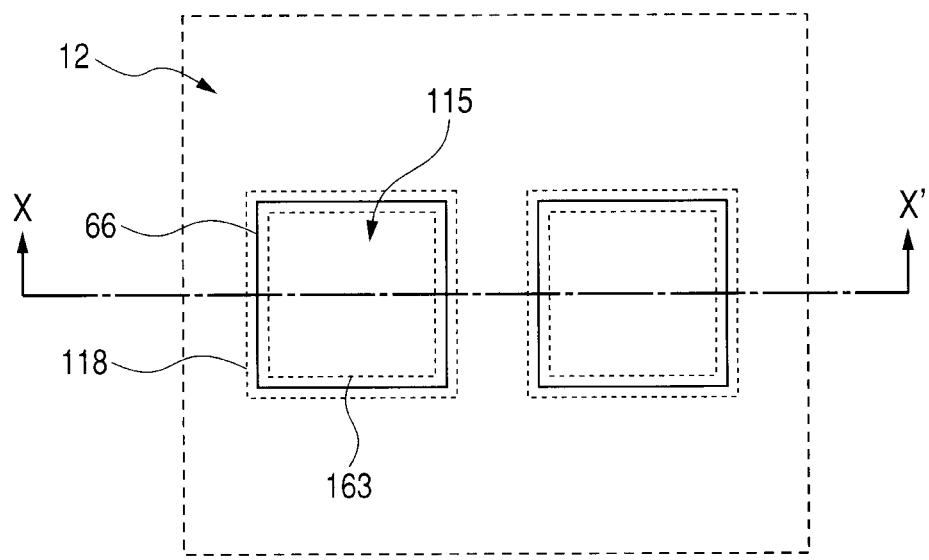
FIG. 22 is an enlarge top view of the part enclosed by the broken line in FIG. 17 in the step corresponding to FIG. 7.
Figure 23:
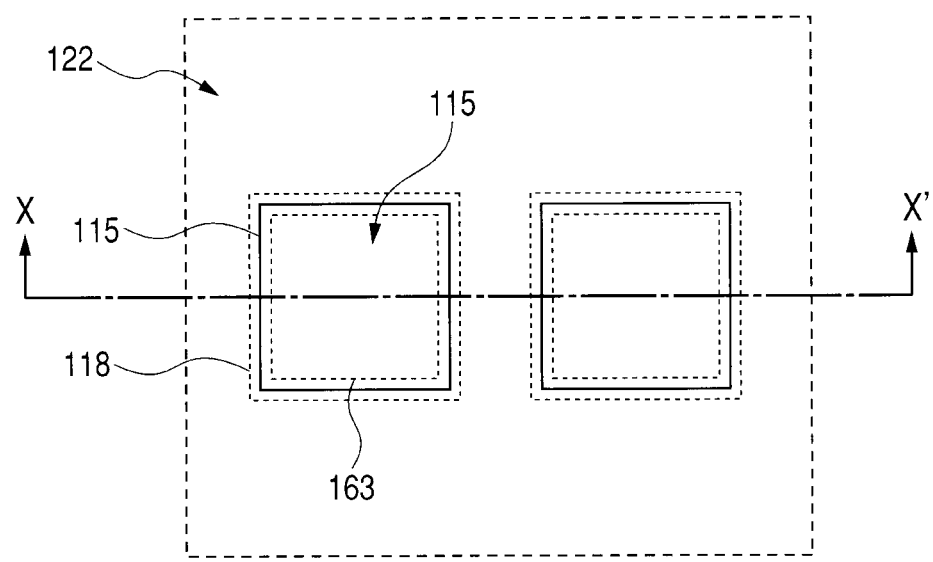
FIG. 23 is an enlarge top view of the part enclosed by the broken line in FIG. 17 in the step corresponding to FIG. 8.
Figure 24:
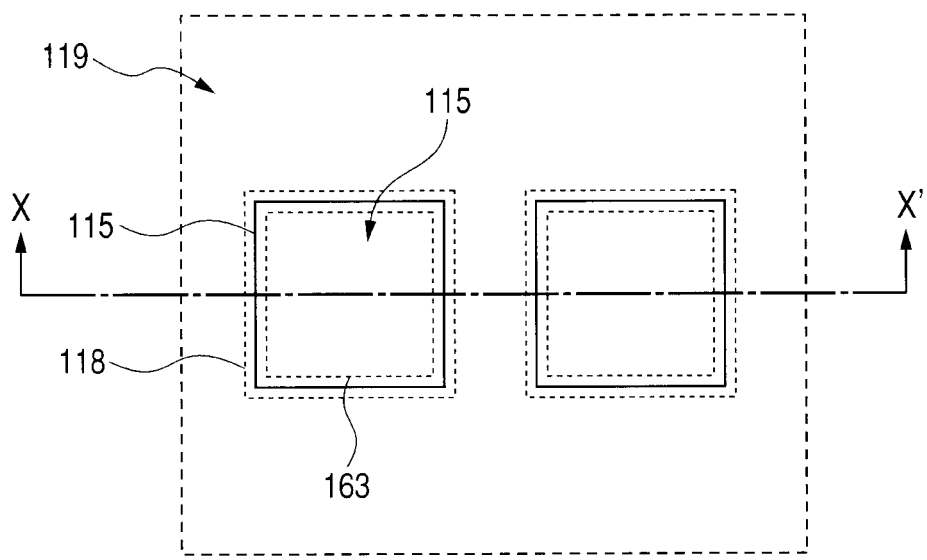
FIG. 24 is an enlarge top view of the part enclosed by the broken line in FIG. 17 in the step corresponding to FIG. 9.
Figure 25:
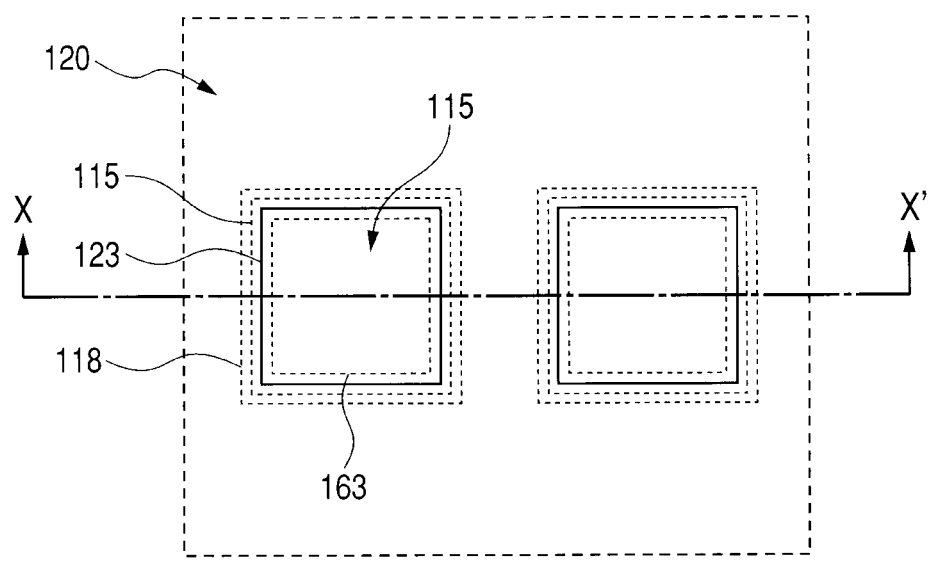
FIG. 25 is an enlarged top view of the step corresponding to FIG. 16.
Figure 26:
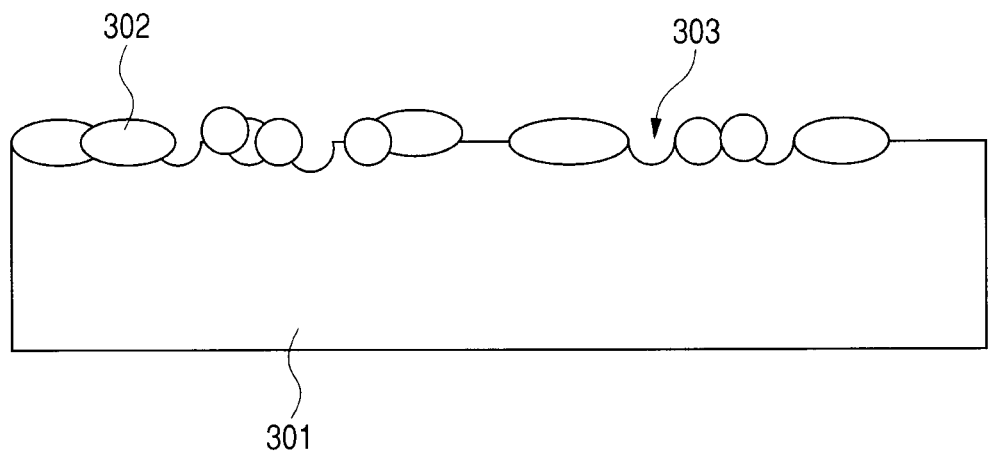
FIG. 26 is an explanatory cross-sectional view for explaining problems of nonelectrolytic gold plating on a nickel surface.
Figure 27:
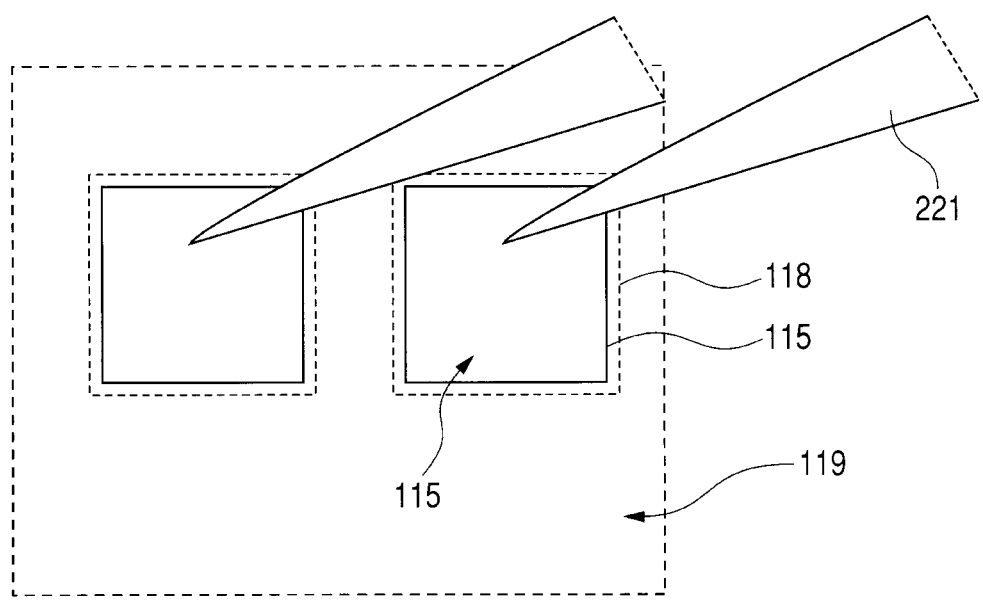
FIG. 27 is an enlarge view of a top surface of a wafer (square pad in a first example) showing a state of a wafer probe test process in the manufacturing procedure of the semiconductor integrated circuit device in the embodiment of the present application.
Figure 28:
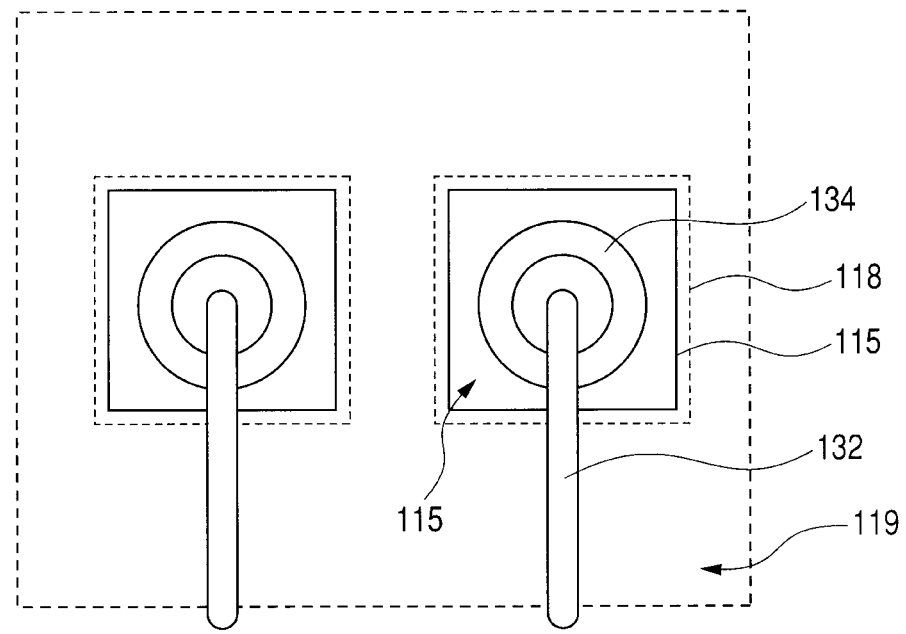
FIG. 28 is an enlarge view of the top surface of the wafer (square pad in the first example) at the time of completion of the wire bonding process in the example corresponding to FIG. 27.
Figure 29:
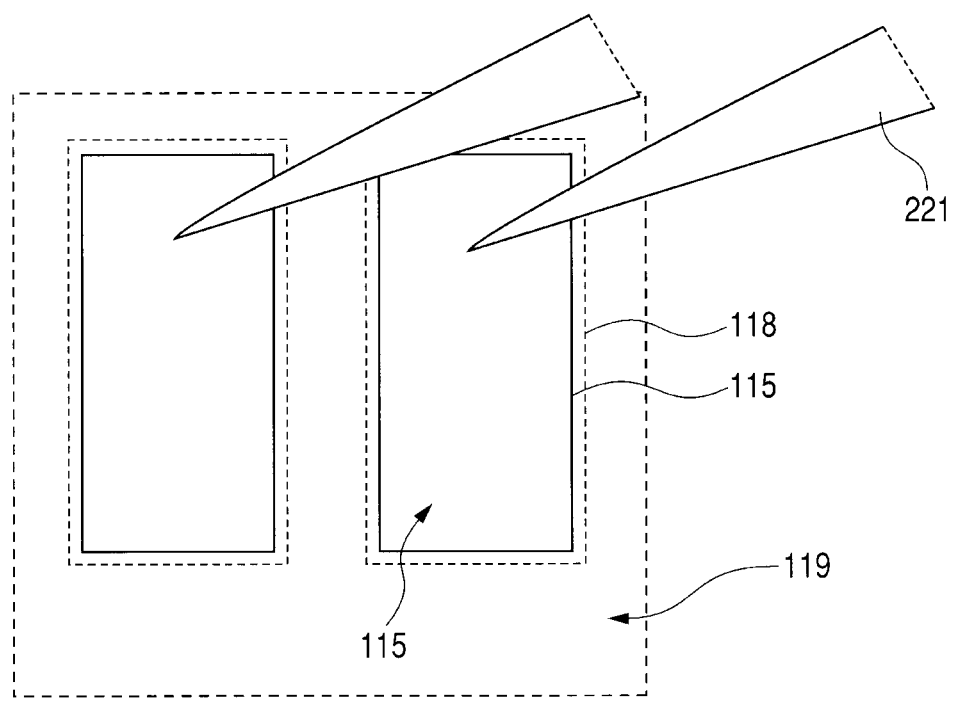
FIG. 29 is an enlarge view of a top surface of another wafer (normal type rectangular pad in a second example) showing the state of the wafer probe test process in the manufacturing procedure of the semiconductor integrated circuit device in the embodiment of the present application.
Figure 30:
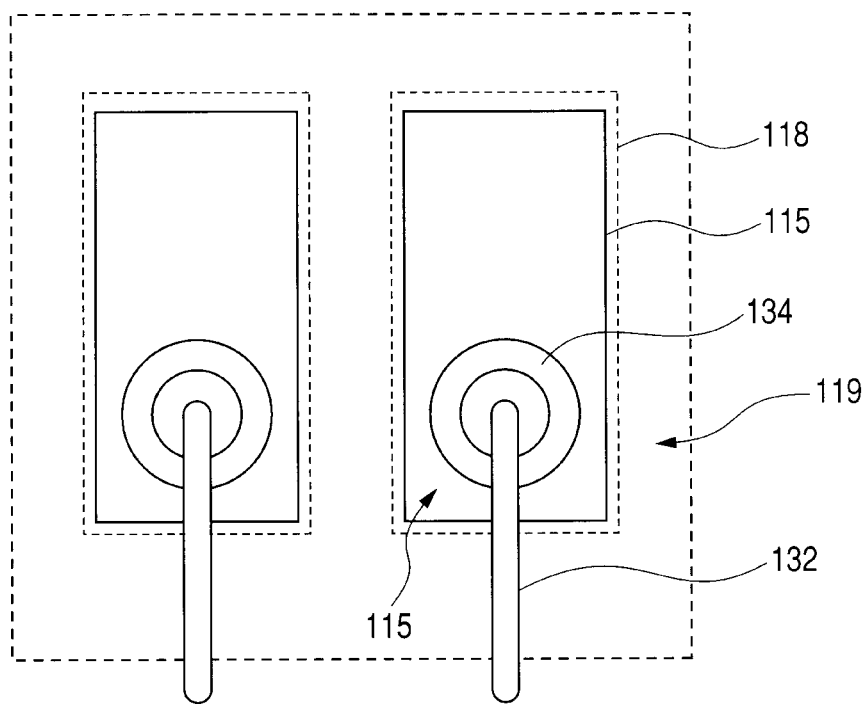
FIG. 30 is an enlarge view of the top surface of the wafer (normal rectangular pad in the second example) at the time of completion of the wire bonding process in the example corresponding to FIG. 29.
Figure 31:
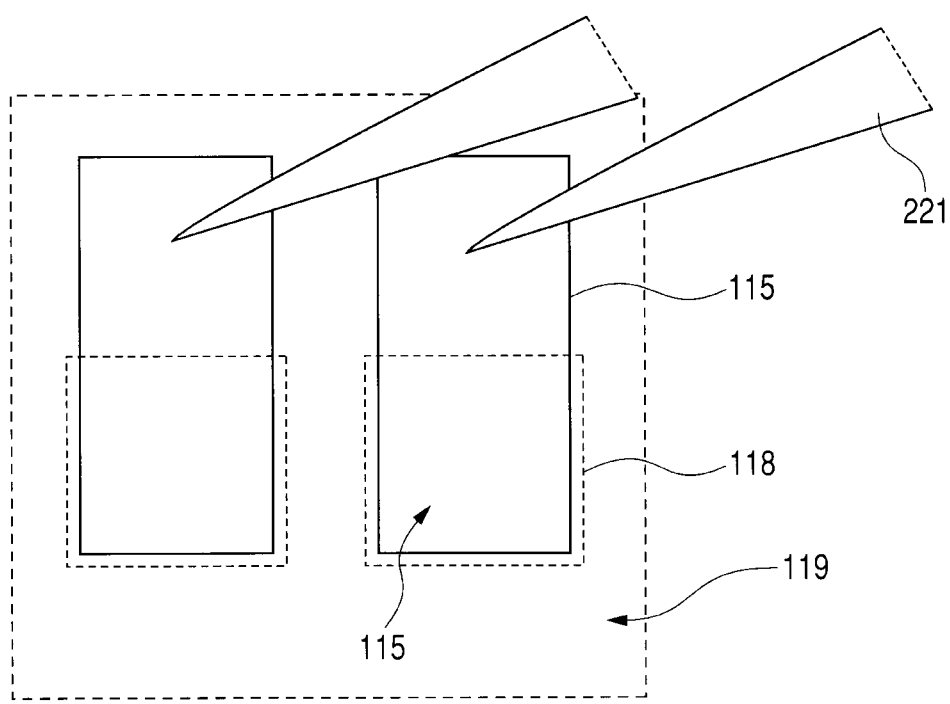
FIG. 31 is an enlarge view of a top surface of a further wafer (modified rectangular pad in a third example) showing the state of the wafer probe test process in the manufacturing procedure of the semiconductor integrated circuit device in the embodiment of the present application.
Figure 32:
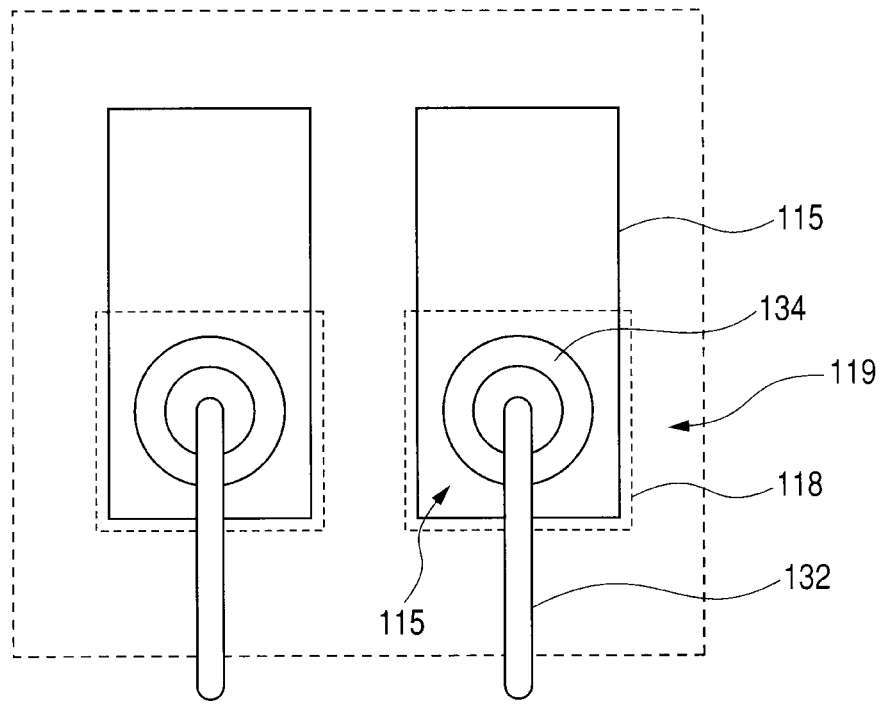
FIG. 32 is an enlarge view of the top surface of the wafer (modified rectangular pad in the third example) at the time of completion of the wire bonding process in the example corresponding to FIG. 31.
Figure 33:
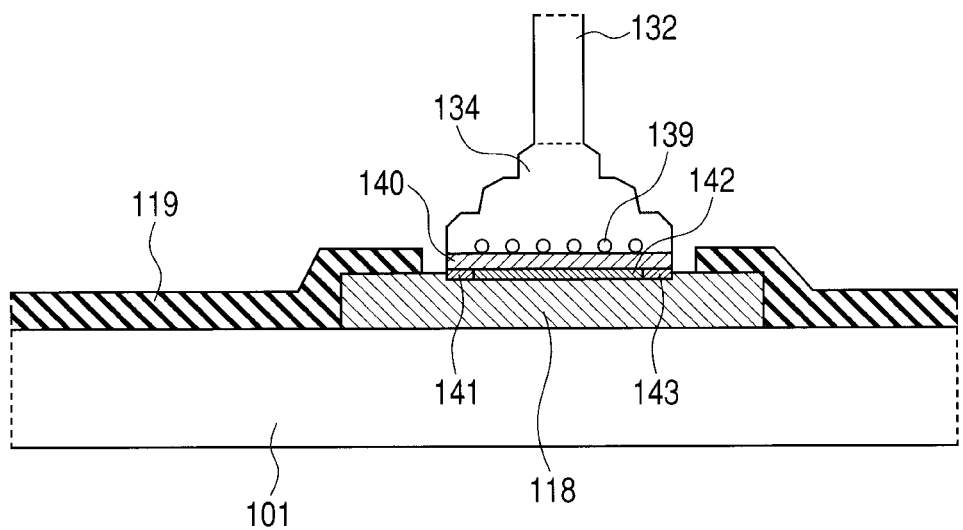
FIG. 33 is a local exemplary cross-sectional view of an aluminum pad and a bonding wire for explaining Kirkendall Void generated in bonding between aluminum and gold.
Figure 34:
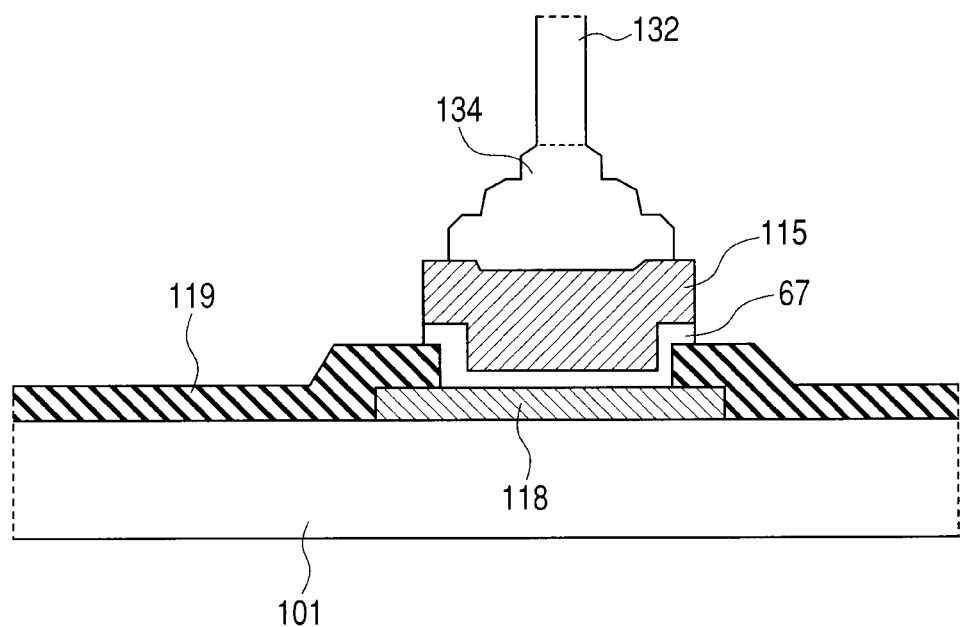
FIG. 34 is a local cross-sectional view showing one of various examples (normal mode) of a bonded state of the bonding wire on the pad at the semiconductor integrated circuit device in the embodiment of the present application.
Figure 35:
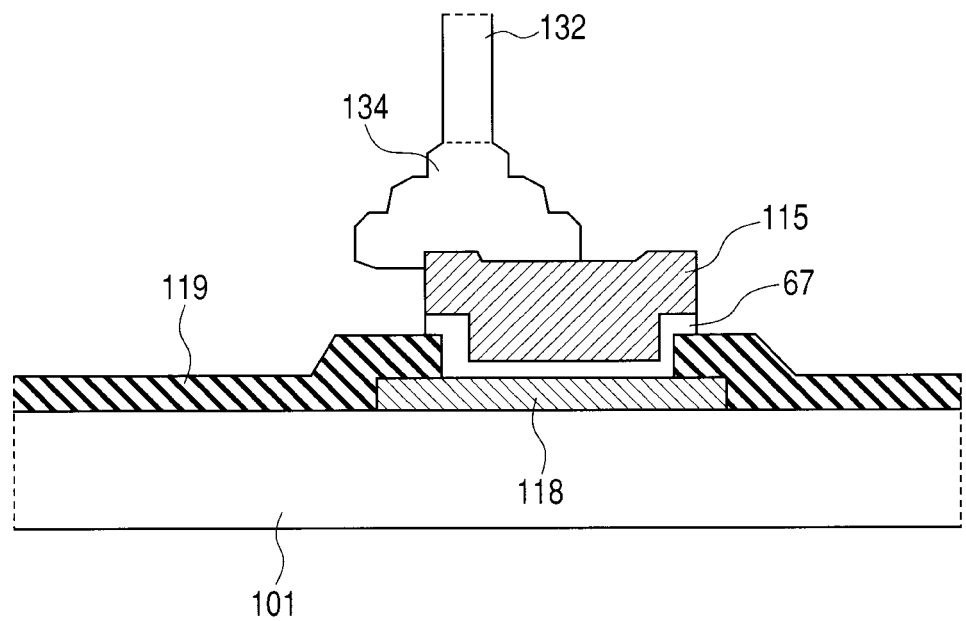
FIG. 35 is a local cross-sectional view showing one of various examples (lateral sliding mode 1) of a bonded state of the bonding wire on the pad at the semiconductor integrated circuit device in the embodiment of the present application.
Figure 36:
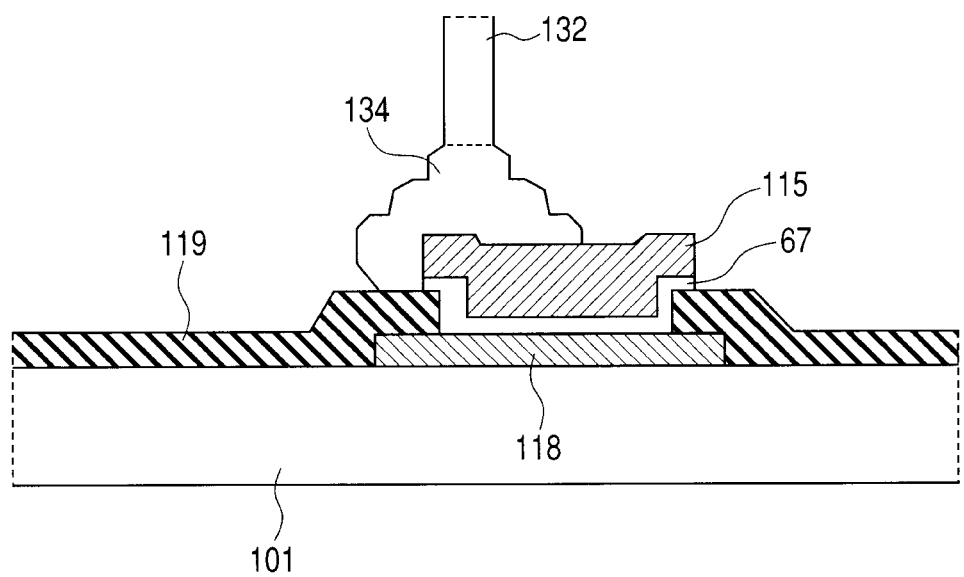
FIG. 36 is a local cross-sectional view showing one of various examples (lateral sliding mode 2) of a bonded state of the bonding wire on the pad at the semiconductor integrated circuit device in the embodiment of the present application.
Figure 37:
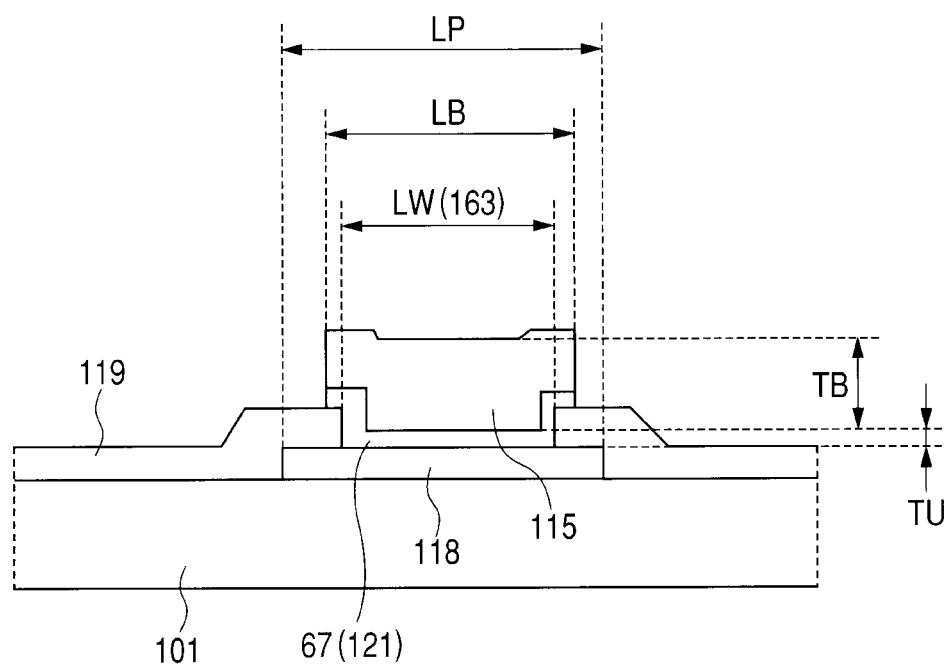
FIG. 37 is a local cross-sectional view for explaining the relationship among various dimensions of a bonded structure of the bonding wire on the pad at the semiconductor integrated circuit device in the embodiment of the present application.
Figure 38:
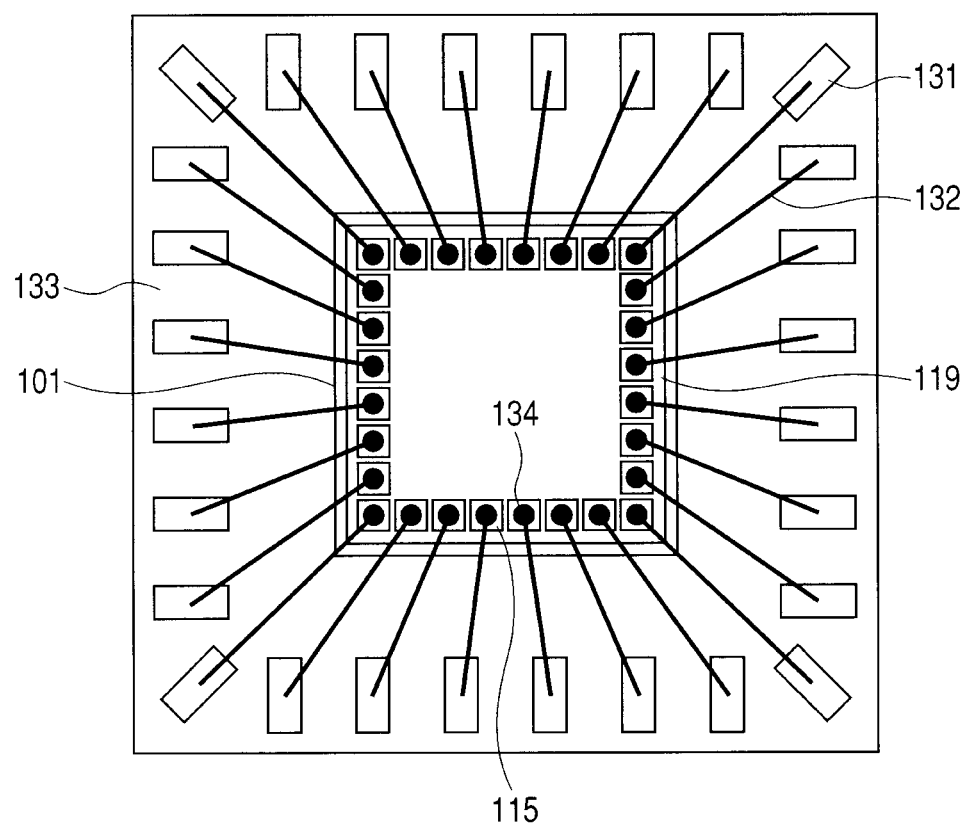
FIG. 38 is an entire top view of the semiconductor integrated circuit device (wire bonding type BGA) at the time of completion of a packaging process in the embodiment of the present application (omitting illustration of a resin sealing member for easy understanding)
Figure 39:
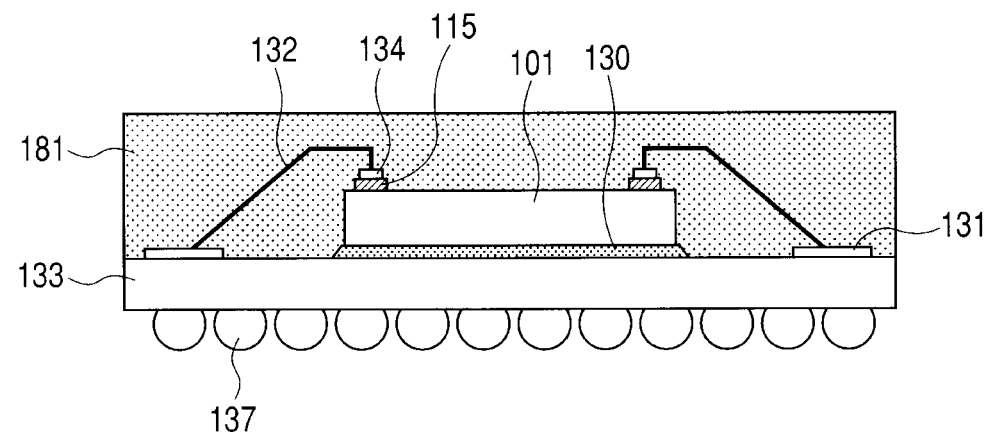
FIG. 39 is an exemplary cross-sectional view of FIG. 38.
Figure 40:
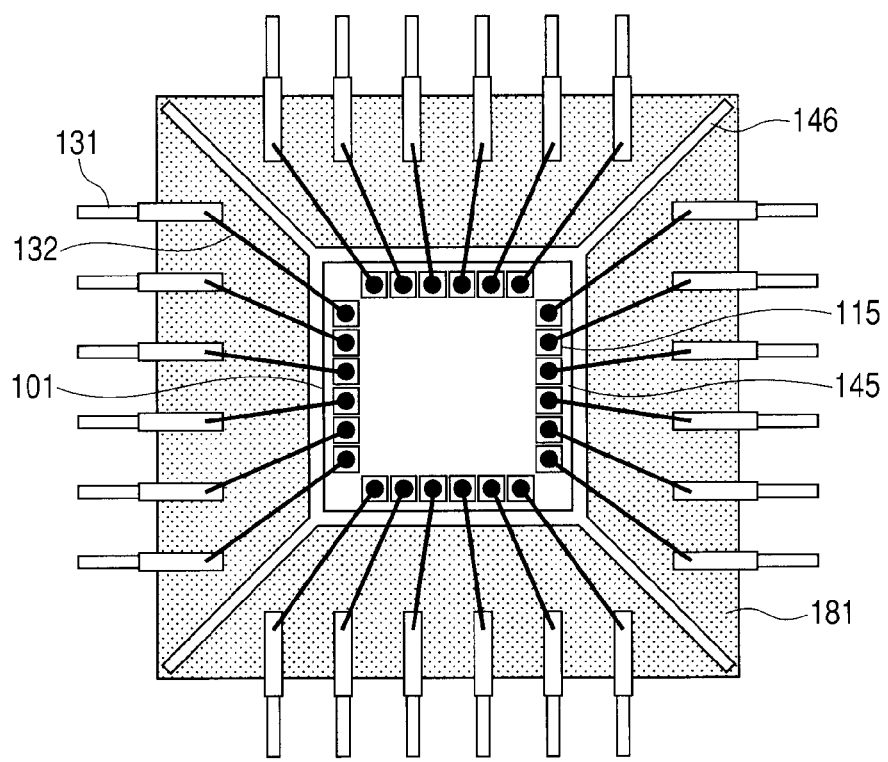
FIG. 40 is an entire top view of the semiconductor integrated circuit device (QFP: Quad Flat Package) at the time of completion of a packaging process in the embodiment of the present application (omitting illustration of an upper half part of the resin sealing member for easy understanding)
Figure 41:
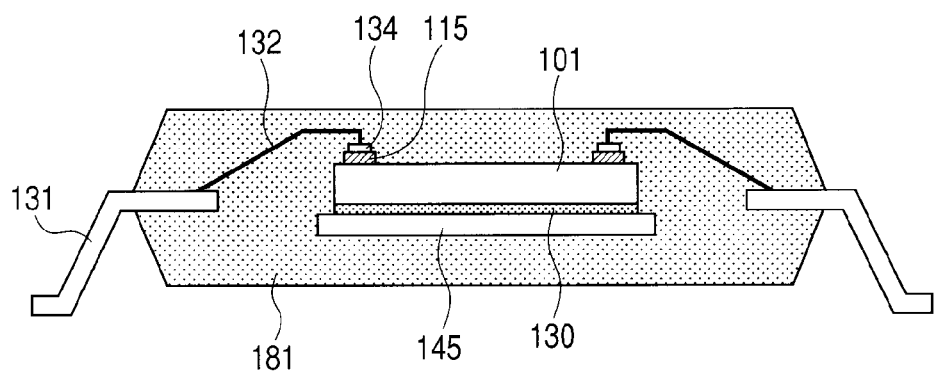
FIG. 41 is an exemplary cross-sectional view of FIG. 40.
Figure 42:
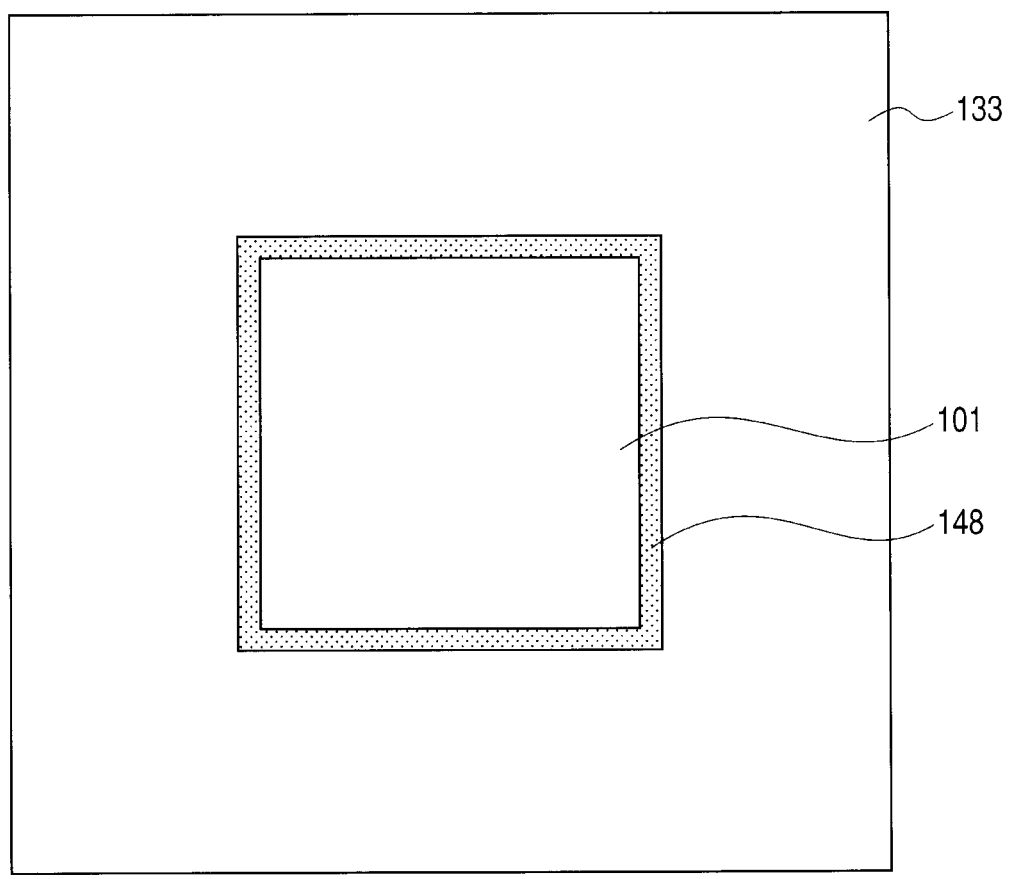
FIG. 42 is an entire top view of the semiconductor integrated circuit device (flip-chip type BGA) at the time of completion of a packaging process in the embodiment of the present application.
Figure 43:
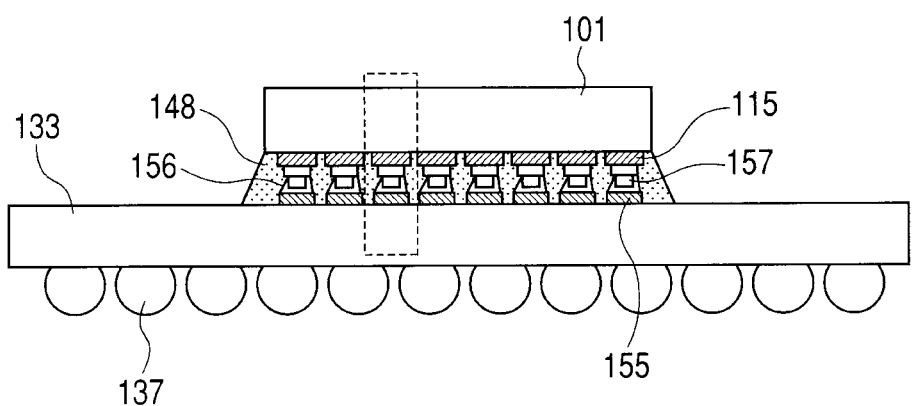
FIG. 43 is an exemplary cross-sectional view of FIG. 42.
Figure 44:
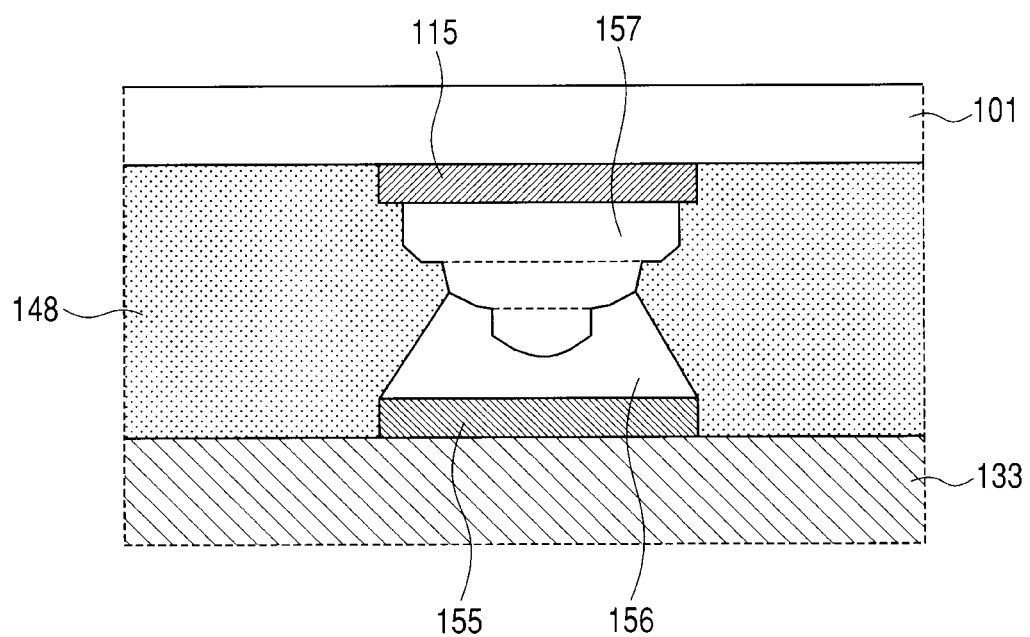
FIG. 44 is an enlarged cross-sectional view of a part enclosed by a broken line in FIG. 43.
Figure 45:
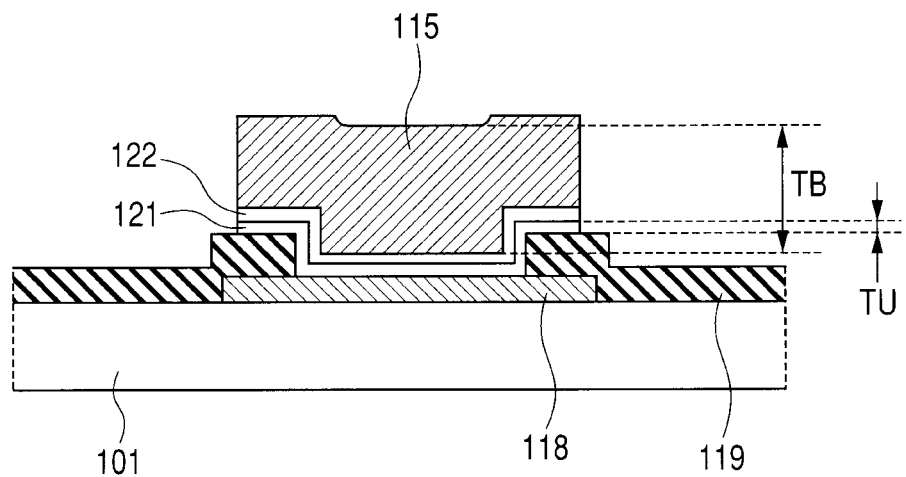
FIG. 45 is a cross-sectional view of the periphery of the pad for explaining one type of under bumb metal structure (two-layered structure) in the semiconductor integrated circuit device of the embodiment of the present application.
Figure 46:
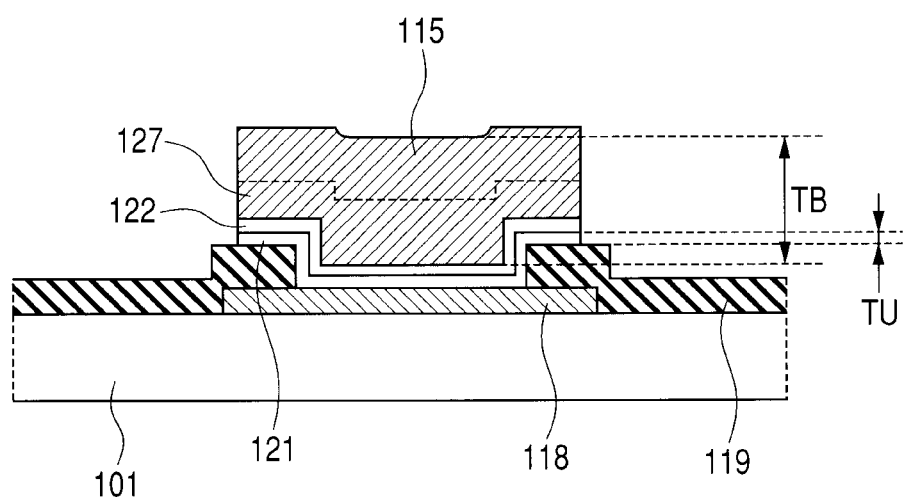
FIG. 46 is a cross-sectional view of the periphery of the pad in a modified example of FIG. 45.
Figure 47:
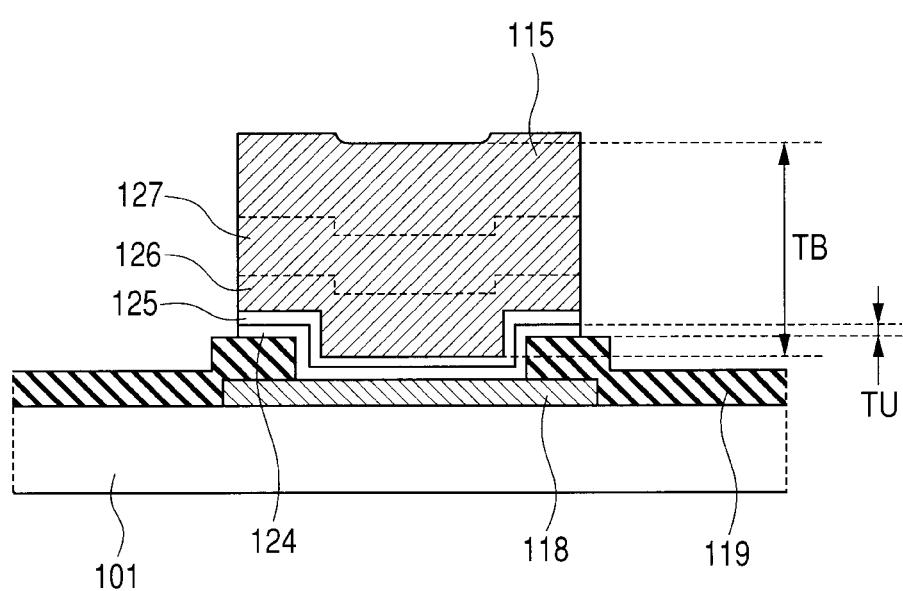
FIG. 47 is a cross-sectional view of the periphery of the pad for explaining another type of underbumb metal structure (three or more—layered multilayer structure) in the semiconductor integrated circuit device of the embodiment of the present application.

FIG. 2 is a process flowchart showing the flow from the pad opening step to the wire bonding process during a manufacturing procedure of the semiconductor integrated circuit device in the embodiment of the present application. FIG. 3 is a process flowchart showing a device section (at the time of completion of the pad opening step) of a semiconductor chip (corresponding to a section taken along the line X-X' of FIG. 18) of the semiconductor integrated circuit device in the embodiment of the present application. FIG. 4 is a process flowchart showing a device section (in a barrier film formation step) of the semiconductor chip (corresponding to a section taken along the line X-X' of FIG. 19) of the semiconductor integrated circuit device in the embodiment of the present application. FIG. 5 is a process flowchart showing a device section (in a resist film application step) of the semiconductor chip (corresponding to a section taken along the line X-X of FIG. 20) of the semiconductor integrated circuit device in the embodiment of the present application. FIG. 6 is a process flowchart showing a device section (in a resist film opening step) of the semiconductor chip (corresponding to a section taken along the line X-X' of FIG. 21) of the semiconductor integrated circuit device in the embodiment of the present application. FIG. 7 is a process flowchart showing a device section (in a gold plating step) of the semiconductor chip (corresponding to a section taken along the line X-X' of FIG. 22) of the semiconductor integrated circuit device in the embodiment of the present application. FIG. 8 is a process flowchart showing a device section (in a resist removal step) of the semiconductor chip (corresponding to a section taken along the line X-X' of FIG. 23) of the semiconductor integrated circuit device in the embodiment of the present application. FIG. 9 is a process flowchart showing a device section (in a barrier metal removal step) of the semiconductor chip (corresponding to a section taken along the line X-X' of FIG. 24) of the semiconductor integrated circuit device in the embodiment of the present application. FIG. 16 is a device cross-sectional view of the semiconductor chip (at the time of completion of a wafer processing step) (corresponding to the section taken along the line X-X' of FIG. 25) of the semiconductor integrated circuit device according to another embodiment of the present application (in an example where two layered polyimide film is provided as an additional final passivation film). FIG. 17 is a top view of the semiconductor chip of the semiconductor integrated circuit device in the embodiment of the present application, corresponding to FIG. 3. FIG. 18 is an enlarged top view (whose corresponding cross-sectional view is shown in FIG. 3) of a part enclosed by a broken line in FIG. 17. FIG. 19 is an enlarged top view of the part enclosed by the broken line in FIG. 17 in the step corresponding to FIG. 4. FIG. 20 is an enlarged top view of the part enclosed by the broken line in FIG. 17 in the step corresponding to FIG. 5. FIG. 21 is an enlarged top view of the part enclosed by the broken line in FIG. 17 in the step corresponding to FIG. 6. FIG. 22 is an enlarged top view of the part enclosed by the broken line in FIG. 17 in the step corresponding to FIG. 7. FIG. 23 is an enlarged top view of the part enclosed by the broken line in FIG. 17 in the step corresponding to FIG. 8. FIG. 24 is an enlarged top view of the part enclosed by the broken line in FIG. 17 in the step corresponding to FIG. 9. FIG. 25 is an enlarged top view of the step corresponding to FIG. 16.

First, as shown in FIGS. 3, 17, and 18, a final passivation film 119 made of, for example, silicon nitride or the like (which is not limited to an inorganic film, but may be an organic film) is formed on a main surface of a wafer 101 including a number of devices and wirings (made of a silicon oxide, or various metal layers) formed therein under the pad (note that a polyimide resin layer 120 is often formed thereon as shown in FIG. 16). The pad opening 163 (which is an opening formed in the final passivation film 119) is provided in a position corresponding to the aluminum pad 118 (in the pad opening step S201 shown in FIG. 2).

Then, sputtering etching is performed in an atmosphere containing argon as a principal component so as to remove a natural oxide film on the surface of the bonding pad 118 in the state shown in FIG. 3 (in a sputtering etching process at step S202 shown in FIG. 2).

Then, as shown in FIGS. 4 and 19, a barrier and seed metal layer (under bump metal film) 67 is formed by sputtering deposition. A barrier metal film 121 as a lower layer can be, for example, a titanium film having a thickness of, for example, about 175 μm (whose thickness can be preferably in a range of 150 to 200 μm) (in a Ti sputtering process at step S203 shown in FIG. 2). A seed metal film 122 as an upper layer can be, for example, a palladium film having a thickness of, for example, about 175 μm (whose thickness can be preferably in a range of about 150 to 200 μm) (in a Pd sputtering process at step S204 shown in FIG. 2).

Then, as shown in FIGS. 5 and 20, a positive type resist film 12 (or a negative type one if necessary) having, for example, a thickness of 4 μm (whose thickness can be preferably in a range of about 2 to 6 μm) is formed on the film 122 (in a resist application process at step S205 shown in FIG. 2).

Then, as shown in FIGS. 6 and 21, the resist is exposed (for example, exposed to i-rays), and developed (for example, by alkaline developer) to form openings 66 (in an exposure process at step S206 and a development process at step S207 as shown in FIG. 2). Subsequently, an oxygen asher process (oxygen plasma process) is performed (for example, at room temperature for about 120 seconds) so as to remove organic contaminants or the like at the bottom of the opening 66 (in an $O_2$ ashing process at step S208 shown in FIG. 2).

Then, as shown in FIGS. 7 and 22, a gold layer serving as a surface metal layer (bump electrode) 115 of, for example, about 2 μm in thickness (whose thickness is preferably in a range of 1 to 5 μm) is embedded in the opening 66 by electroplating (in an electrolytic plating process at step S209 shown in FIG. 2). Conditions for plating can be, for example, that as to a wafer of 300

What is claimed is:

1. A semiconductor integrated circuit device, comprising:
    (a) a wiring member having a chip mounting portion and an electrode terminal;
    (b) a semiconductor chip mounted over the chip mounting portion of the wiring member and including:
        (b1) a pad electrode provided over a device surface of the semiconductor chip;
        (b2) an insulating film formed over the device surface and in which an opening is formed such that a part of the pad electrode is exposed from the opening;
        (b3) a barrier metal film provided over the part of the pad electrode exposed from the opening; and
        (b4) a surface metal film provided over the barrier metal film;
    (c) a bonding wire electrically connected to the surface metal film of the semiconductor chip and the electrode terminal of the wiring member; and
    (d) a sealing body sealing the semiconductor chip and the bonding wire,
    wherein, in plan view, the surface metal film has a rectangular shape with two longer sides and two shorter sides,
    wherein, in plan view, the surface metal film is surrounded by a perimeter of the pad electrode, and
    wherein, in a cross-sectional view, at each side of the opening in the insulating film, a distance component from an outer edge of the pad electrode to an adjacent edge of the surface metal film along a direction parallel to the device surface of the semiconductor chip is greater than a distance component from the adjacent edge of the surface metal film to an adjacent edge of the opening along the direction parallel to the device surface.

2. The semiconductor integrated circuit device according to claim 1,
    wherein, in plan view, the semiconductor chip has a quadrangular shape, and
    wherein, in plan view, the surface metal film is disposed such that the two shorter sides thereof are substantially parallel to a first side of the semiconductor chip and a direction in which two longer sides thereof extend intersects with a direction in which the first side of the semiconductor chip extends.

3. The semiconductor integrated circuit device according to claim 2,
    wherein, in plan view, a first shorter side of the two shorter sides of the surface metal film is closer than a second shorter side of the two shorter sides thereof to the first side of the semiconductor chip, and
    wherein, in plan view, a connecting part of the bonding wire and the surface metal film is closer to the first shorter side of the surface metal film than to the second shorter side of the surface metal film.

4. The semiconductor integrated circuit device according to claim 3, wherein, in plan view, a part between the connecting part of the bonding wire and the surface metal film and the second shorter side of the surface metal film is a part which can contact a test probe.

5. The semiconductor integrated circuit device according to claim 3, wherein, in plan view, a part of the bonding wire crosses the first shorter side of the surface metal film.

6. The semiconductor integrated circuit device according to claim 1, wherein, in plan view, the pad electrode has rectangular shape with two longer sides and two shorter sides.

7. The semiconductor integrated circuit device according to claim 1, wherein, in a cross-section view of the pad electrode, a part of the barrier metal film contacts a part of a top surface of the insulating film around the opening.

8. The semiconductor integrated circuit device according to claim 7, wherein, in the cross-section view of the pad electrode, a width of the barrier metal film is greater than a width of the opening.

9. The semiconductor integrated circuit device according to claim 8, wherein, in the cross-section view of the pad electrode, a width of the surface metal film is same as the width of the barrier metal film.

10. The semiconductor integrated circuit device according to claim 9, wherein, in the cross-section view of the pad electrode, the width of the surface metal film is narrower than a width of the pad electrode.

11. The semiconductor integrated circuit device according to claim 1,
wherein the pad electrode includes aluminum as a principal component,
wherein the surface metal film includes gold as a principal component, and
wherein the bonding wire includes copper as a principal component.

12. The semiconductor integrated circuit device according to claim 1,
wherein the bonding wire is electrically connected to the surface metal film of the semiconductor chip via a ball portion of the bonding wire, and
wherein, in plan view, the ball portion is located within a perimeter of the surface metal film.

13. The semiconductor integrated circuit device according to claim 1,
wherein the electrode terminal is a lead, and
wherein a part of the electrode terminal projects from the sealing body.

14. The semiconductor integrated circuit device according to claim 1,
wherein a seed metal film is disposed between and in contact with the barrier metal film and the surface metal film, and
the seed metal film is composed of a material different from that of the barrier and surface metal films.

15. The semiconductor integrated circuit device according to claim 1, wherein a connecting part of the bonding wire that contacts the surface metal film is offset from a center of the surface metal film with respect to a direction parallel to said two shorter sides, such that, in plan view, at least a portion of the connecting part is outside of the opening in the insulating film.

16. The semiconductor integrated circuit device according to claim 15, wherein the connecting part of the bonding wire contacts the surface metal film and the insulating film.

* * * * *